(12) United States Patent
Myung et al.

(10) Patent No.: US 11,989,531 B2
(45) Date of Patent: May 21, 2024

(54) DEVICE AND METHOD WITH MULTI-BIT OPERATION

(71) Applicant: Samsung Electronics Co., Ltd., Suwon-si (KR)

(72) Inventors: Sungmeen Myung, Suwon-si (KR); Seungchul Jung, Suwon-si (KR); Sangjoon Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 148 days.

(21) Appl. No.: 17/473,139

(22) Filed: Sep. 13, 2021

(65) Prior Publication Data

US 2022/0326910 A1 Oct. 13, 2022

(30) Foreign Application Priority Data

Apr. 13, 2021 (KR) ........................ 10-2021-0048025

(51) Int. Cl.
*G06F 7/50* (2006.01)
*G06F 7/523* (2006.01)
(Continued)

(52) U.S. Cl.
CPC ................ *G06F 7/50* (2013.01); *G06F 7/523* (2013.01); *G06N 3/065* (2023.01); *G11C 11/56* (2013.01); *H03M 1/38* (2013.01)

(58) Field of Classification Search
CPC .......... G06F 7/50; G06F 7/523; G06F 7/5443; G06F 17/153; G06F 17/16; G06N 3/065; G11C 11/56
See application file for complete search history.

(56) References Cited

U.S. PATENT DOCUMENTS 9,779,355 B1 * 10/2017 Leobandung ............ G06N 3/04
2019/0108193 A1 4/2019 Buchanan
(Continued)

FOREIGN PATENT DOCUMENTS

DE 102021207970 A1 * 1/2022 ............ G06N 3/063
KR 10-2021-0119805 A 10/2021

OTHER PUBLICATIONS

Xue, Cheng-Xin, et al. "A 1Mb Multibit ReRAM Computing-In-Memory Macro with 14.6ns Parallel MAC Computing Time for CNN Based AI Edge Processors." *International Solid-State Circuits Conference—(ISSCC) IEEE, vol. 24 Issue 1* 2019 (3 pages in English).

(Continued)

*Primary Examiner* — Emily E Larocque
(74) *Attorney, Agent, or Firm* — NSIP Law

(57) ABSTRACT

A multi-bit cell includes: a memory storing a weight resistance corresponding to a multi-bit weight; a current source configured to apply a current to the memory to generate a weight voltage from the weight resistance; a plurality of multiplexers connected to each other in parallel and connected to the memory in series, each of the multiplexers being configured to output one signal of the weight voltage and a first fixed voltage based on a multi-bit input; and a plurality of capacitors connected to the plurality of multiplexers, respectively, each of the capacitors being configured to store a respective weight capacitance, and to generate charge data by performing an operation on the outputted signal and the weight capacitance.

19 Claims, 15 Drawing Sheets

(51) Int. Cl.
*G06N 3/065* (2023.01)
*G11C 11/56* (2006.01)
*H03M 1/38* (2006.01)

(56) References Cited

U.S. PATENT DOCUMENTS

| | | |
|---|---|---|
| 2019/0362787 A1 | 11/2019 | Lu et al. |
| 2020/0035305 A1 | 1/2020 | Choi et al. |
| 2020/0202204 A1 | 6/2020 | Kouno et al. |
| 2020/0356620 A1 | 11/2020 | Yen et al. |
| 2021/0103804 A1 | 4/2021 | Turbiner |
| 2021/0271959 A1* | 9/2021 | Chettuvetty ........... G06G 7/163 |
| 2021/0303266 A1 | 9/2021 | Myung et al. |
| 2021/0397937 A1* | 12/2021 | Keskin ................... G11C 5/145 |
| 2022/0066740 A1* | 3/2022 | Radhadevi ............... G06G 7/16 |
| 2022/0076737 A1* | 3/2022 | Cosemans .............. G11C 27/00 |

OTHER PUBLICATIONS

Dong, Qing, et al. "15.3 A 351TOPS/W and 372.4 GOPS Compute-in-Memory SRAM Macro in 7nm FinFET CMOS for Machine-Learning Applications." *International Solid-State Circuits Conference—(ISSCC). IEEE, vol. 15 Issue 3* 2020 (3 pages in English).

Xue, Cheng-Xin, et al. "15.4 A 22nm 2Mb ReRAM Compute-in-Memory Macro with 121-28TOPS/W for Multibit MAC Computing for Tiny AI Edge Devices." *International Solid-State Circuits Conference—(ISSCC). IEEE, vol. 15 Issue 4* 2020 (3 pages in English).

Sanni, Kayode et al., "A Charge-Based Architecture for Energy-Efficient Vector-Vector Multiplication in 65nm CMOS," 2018 IEEE International Symposium on Circuits and Systems (ISCAS), 2018, (5 Pages in English).

Extended European Search Report dated Sep. 2, 2022, in counterpart European Patent Application No. 22167010.2 (11 Pages in English).

* cited by examiner

DEVICE AND METHOD WITH MULTI-BIT OPERATION

CROSS-REFERENCE TO RELATED APPLICATIONS

This application claims the benefit under 35 U.S.C. § 119(a) to Korean Patent Application No. 10-2021-0048025, filed on Apr. 13, 2021, in the Korean Intellectual Property Office, the entire disclosure of which is incorporated herein by reference for all purposes.

BACKGROUND

1. Field

The present disclosure relates to a device and a method with a multi-bit operation.

2. Description of the Related Art

The operations of a neural network may include a multiply-accumulate (MAC) operation that repeats multiplications and summations. In a certain node of a neural network, an operation may be performed in which the values of nodes of the previous layer are multiplied respectively by weights mapped to the respective nodes, the resulting products are summed up, and then an appropriate activation function is applied to the sum. In order to perform such an operation, a memory access operation of loading an appropriate input and weight at a desired time and a MAC operation of multiplying and adding the loaded input and weight may be repeated. Furthermore, in a field other than neural networks, an operation with respect to inputs and weights may be required. Instead of processing an operation with respect to inputs and weights by using a generally known digital computer, a method for more efficiently processing an operation with respect to inputs and weights may use other hardware architectures or the like.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a multi-bit cell includes: a memory storing a weight resistance corresponding to a multi-bit weight; a current source configured to apply a current to the memory to generate a weight voltage from the weight resistance; a plurality of multiplexers connected to each other in parallel and connected to the memory in series, each of the multiplexers being configured to output one signal of the weight voltage and a first fixed voltage based on a multi-bit input; and a plurality of capacitors connected to the plurality of multiplexers, respectively, each of the capacitors being configured to store a respective weight capacitance, and to generate charge data by performing an operation on the outputted signal and the weight capacitance.

The memory may include a plurality of resistive elements connected to each other in series, a number of the resistive elements may correspond to a number of bits of the multi-bit weight, and the multi-bit cell may be configured to adjust the weight resistance by controlling ON/OFF of each of the resistive elements.

Each of the plurality of multiplexers may be configured to: receive an input of 1 or 0; output the weight voltage in response to receiving the input of 1; and output the first fixed voltage in response to receiving the input of 0.

In response to all of the plurality of multiplexers outputting the first fixed voltage, the multi-bit cell may be configured to reduce power consumption by turning off the current source.

A magnitude of a second fixed voltage transmitted to a terminal opposite to a terminal of the capacitor to which the output signal is transmitted may be a same as a magnitude of the first fixed voltage, and each of the plurality of capacitors, in response to reception of the first fixed voltage, may be configured to receive a voltage of 0 V according to potentials at both terminals thereof being same, and to generate charge data of 0 C.

The weight resistance may be set to linearly increase as the multi-bit weight increases, and the magnitude of the second fixed voltage may be set such that a difference value between the second fixed voltage and the weight voltage is proportional to the multi-bit weight.

A number of the capacitors may correspond to a number of bits of the multi-bit input, and each of the capacitors may be configured to store a weight capacitance of a value corresponding to a position of a respective digit of the multi-bit input.

A value of each digit constituting the multi-bit input may be input to a multiplexer of the multiplexers connected to a capacitor of the capacitors corresponding to a position of the digit.

Each of the plurality of capacitors may be configured to: receive the output signal at one terminal thereof; receive the second fixed voltage at a terminal opposite to the one terminal; perform a subtraction operation of the second fixed voltage with respect to the output signal; and multiply a difference value by the weight capacitance to generate the charge data.

The multi-bit cell may be configured to output first summed data generated by summing the charge data generated by each of the plurality of capacitors.

The memory may include a first memory and a second memory that each store different weight resistances, the multi-bit cell further may include a sign multiplexer configured to determine, based on a sign input, one memory of either the first memory and the second memory to which the current is to be applied, and the multi-bit cell may be configured to generate a weight voltage from the weight resistance stored in the determined memory.

The memory may include a first memory storing a first weight resistance and a second memory storing a second weight resistance, the current source may include a first current source configured to apply a current to the first memory to generate a first weight voltage, and a second current source configured to apply a current to the second memory to generate a second weight voltage, and each of the plurality of multiplexers may be configured to output any one of the first weight voltage, the second weight voltage, and the first fixed voltage, based on the multi-bit input including a sign input.

A multi-bit operation device may include a plurality of multi-bit cells, wherein the multi-bit operation device may be configured to output second summed data generated by summing first summed data output from each of the plurality of multi-bit cells.

The multi-bit operation device may include a converter configured to convert the second summed data, which is analog data, into digital data, wherein the converter may include a comparator, a plurality of reference voltage cells, and a successive approximation register (SAR) logic.

In another general aspect, a method of performing a multi-bit operation includes: applying a current to a memory storing a weight resistance corresponding to a multi-bit weight, to generate a weight voltage from the weight resistance; receiving a multi-bit input with respect to a plurality of capacitors each storing a respective weight capacitance; outputting one signal of the weight voltage and a first fixed voltage to each of the plurality of capacitors based on the multi-bit input; and generating charge data stored in each of the plurality of capacitors by performing an operation on the outputted signal and the weight capacitance.

The method may include outputting first summed data generated by summing the charge data stored in each of the plurality of capacitors.

The method may include: performing the outputting of the first summed data at each of a plurality of multi-bit cells; and outputting second summed data generated by summing the first summed data output from each of the plurality of multi-bit cells.

The method may include converting the second summed data, which is analog data, into digital data.

In one general aspect, one or more embodiments include a non-transitory computer-readable storage medium storing instructions that, when executed by a processor, configure the processor to perform any one, any combination, or all operations and methods described herein.

In another general aspect, a multi-bit cell includes: a memory storing a weight resistance corresponding to a multi-bit weight, wherein a weight voltage is generated in response to a current being applied to the memory; and a plurality of capacitors each configured to store a respective weight capacitance, and to generate charge data by performing an operation on the weight capacitance and either one of the weight voltage and a first fixed voltage.

The multi-bit cell may include a plurality of multiplexers connected to each other in parallel and connected to the memory in series, each of the multiplexers being configured to output either one of the weight voltage and a first fixed voltage based on a multi-bit input.

The memory may include a plurality of resistive elements, and a number of the resistive elements is equal to a greatest value of a number of bits of the multi-bit weight.

The multi-bit cell may be configured to linearly adjust the weight resistance by controlling ON/OFF of resistive elements of the memory in response to a change in the multi-bit weight.

The multi-bit cell may be configured to turn off the current source in response to the multi-bit input being 0.

Other features and aspects will be apparent from the following detailed description, the drawings, and the claims.

Figure 1:
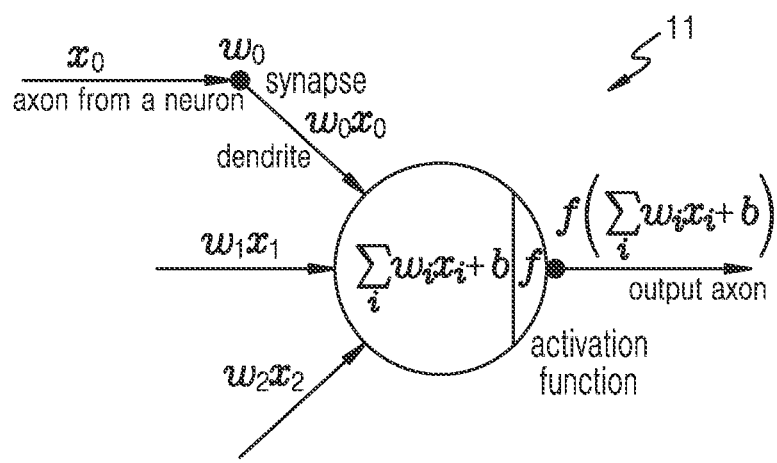
FIG. 1 illustrates a neural network node model according to one or more embodiments.

Throughout the drawings and the detailed description, unless otherwise described or provided, the same reference numerals refer to the same or like elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art, after an understanding of the disclosure of this application, may be omitted for increased clarity and conciseness.

Reference will now be made in detail to embodiments, examples of which are illustrated in the accompanying drawings, wherein like reference numerals refer to like elements throughout. In this regard, the one or more embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof. The use of the term "may" herein with respect to an example or embodiment (for example, as to what an example or embodiment may include or implement) means that at least one example or embodiment exists where such a feature is included or implemented, while all examples are not limited thereto.

Throughout the specification, it will be understood that when a component or element is referred to as being "on," "connected to" or "coupled to" another component or element, it may be directly on, connected to, or coupled to the other component or element, or there may be one or more intervening elements therebetween. In contrast, when a component or element is referred to as being "directly on," "directly connected to," or "directly coupled to" another component or element, there are no intervening components or elements present. Likewise, expressions, for example, "between" and "immediately between" and "adjacent to" and "immediately adjacent to" may also be construed as described in the foregoing.

Although terms of "first" or "second" are used to explain various members, components, regions, layers, or sections, the members, components, regions, layers, or sections are not limited to the terms. These terms should be used only to distinguish one member, component region, layer, or section from another member, component region, layer, or section. For example, a "first" member, component region, layer, or section referred to in examples described herein may also be referred to as a "second" member, component region, layer, or section, or similarly, and the "second" member, component region, layer, or section may be referred to as the "first" member, component region, layer, or section within the scope of the right according to the concept of the present disclosure.

It should be understood that the scope of the embodiments is not limited by the description of certain embodiments below and matters that can be easily derived by those of ordinary skill in the art fall within the scope of the embodiments. Exemplary embodiments will be described in detail with reference to the accompanying drawings below.

FIG. 1 illustrates a neural network node model according to one or more embodiments.

Various attempts have been made to develop a computing device for efficiently processing a vast amount of information by simulating biological neurons or a biological neural network composed of biological neurons connected to each other. The neural network node model 11 may be an example of neuromorphic operations executed by a hardware computing device or a hardware computing processor. The neural network node model 11 may include a multiplication operation of multiplying information from a plurality of neurons by synaptic weights, a summation operation ($\Sigma$) of summing up products ($w_0x_0$, $w_1x_1$, and $w_2x_2$) of the multiplication operation, and an operation of applying a characteristic function b and an activation function f to a result of the summation operation. A neuromorphic operation result may be provided by executing a neuromorphic operation. Here, values $x_0$, $x_1$, $x_2$, ... may correspond to axon values, and values $w_0$, $w_1$, $w_2$, ... may correspond to synaptic weights. While the nodes, values, and weights of the neural network node model 11 may be respectively referred to as "neurons," "axon values," and "synaptic weights," such reference is not intended to impart any relatedness with respect to how the neural network architecture computationally maps or thereby intuitively recognizes information and how a human's neurons operate. I.e., the terms are merely terms of art referring to the hardware implemented nodes, values, and weights of the neural network node model 11.

Figure 2:
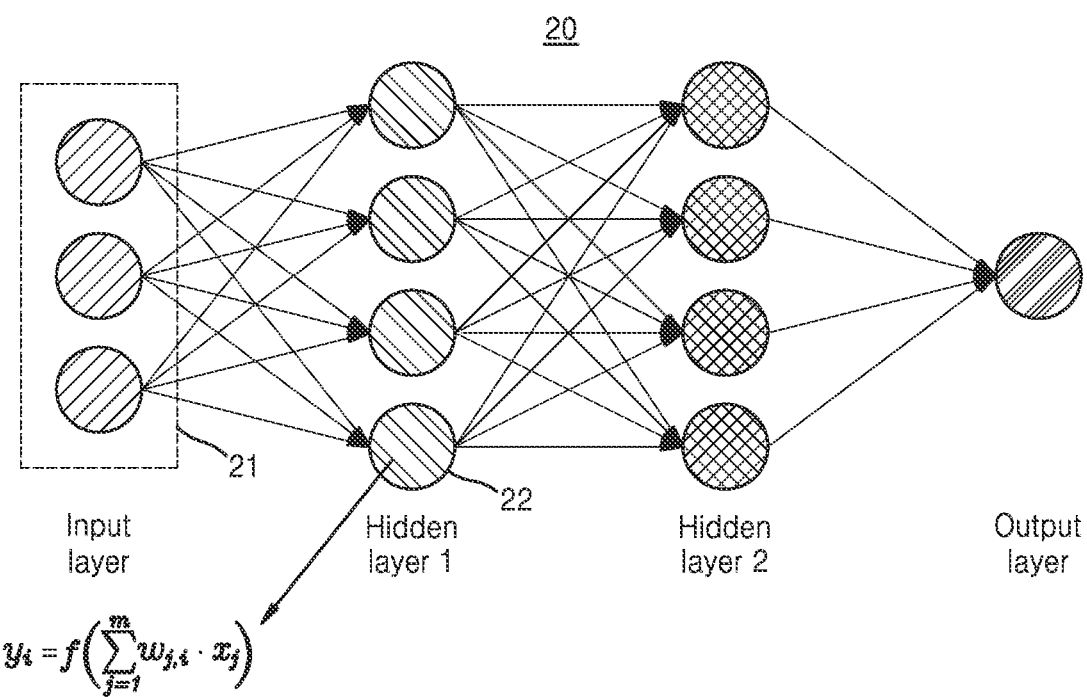
FIG. 2 illustrates a neural network according to one or more embodiments.

FIG. 2 illustrates a neural network (e.g., a neural network 20) according to one or more embodiments.

FIG. 2 illustrates an example of a neural network, i.e., the neural network 20, which includes a neural network composed of nodes connected to each other. The neural network 20 may correspond to an example of a deep neural network (DNN). For convenience of description, the neural network 20 is illustrated as including two hidden layers, but may include various numbers of hidden layers. In addition, although FIG. 2 illustrates that the neural network 20 includes a separate input layer 21 for receiving input data, the input data may be directly input to the hidden layer.

Nodes of layers other than an output layer in the neural network 20 may be connected to nodes of a next layer through links for transmitting output signals. Through these links, outputs of activation functions with respect to weighted inputs of nodes included in a previous layer may be input to the nodes. The weighted inputs are products of inputs (node values) of the nodes and weights, the input correspond to the axon values, and the weights correspond to the synaptic weights. The weight may be referred to as a parameter of the neural network 20. The activation functions may include a sigmoid function, a hyperbolic tangent (tan h) function, and a rectified linear unit (ReLU) function, and nonlinearity may be introduced into the neural network 20 by the activation functions.

An output of a certain node 22 included in the neural network 20 may be represented by Equation 1 below.

$$y_i = f\left(\sum_{j=1}^{m} w_{j,i} x_j\right) \quad \text{Equation 1}$$

Equation 1 may represent an output value $y_i$ of an $i^{th}$ node 22 in an arbitrary layer, with respect to m input values. Here, $x_j$ may denote an output value of a $j^{th}$ node of a previous layer, and $w_{j,i}$ may denote a weight corresponding to the output value of the $j^{th}$ node and the node 22 of the current layer. f( ) may denote an activation function. As shown in Equation 1, a result of summing up respective products of the input values corresponding to $x_j$ and the weights corresponding to $w_{j,i}$ may be applied to the activation function. In other words, an operation (MAC operation) of multiplying an appropriate input value $x_j$ by a weight $w_{j,i}$ and accumulating a sum of products at a desired time may be repeated. In addition to this purpose, there are various application fields performing the MAC operation, and to this end, a multi-bit operation device capable of processing a MAC operation in an analog domain may be used.

Figure 3A:
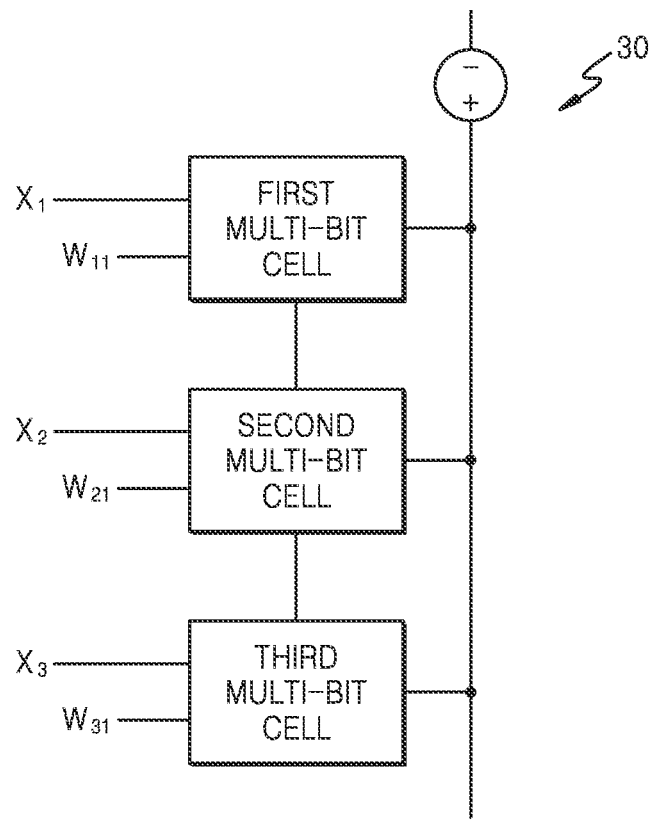
FIG. 3A and FIG. 3B are diagrams for describing a multi-bit operation device according to one or more embodiments.
Figure 3B:
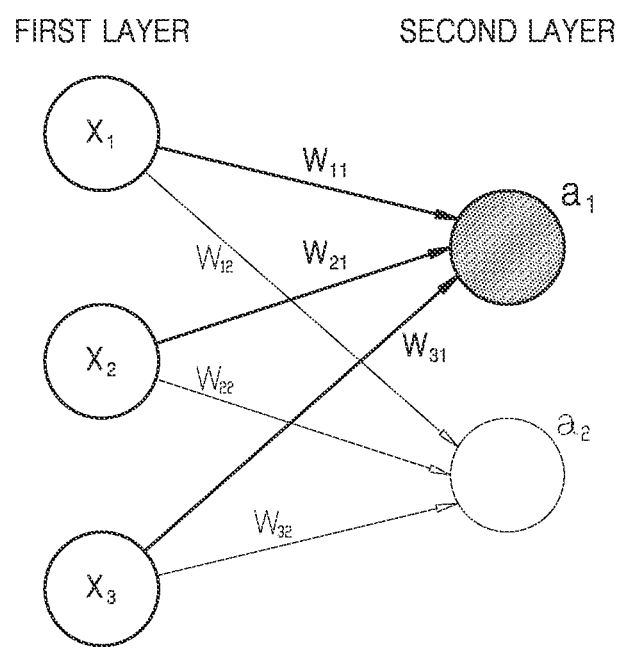

FIG. 3A and FIG. 3B are diagrams for describing a multi-bit operation device according to one or more embodiments.

FIG. 3A is a diagram illustrating an architecture of a multi-bit operation device 30 according to an embodiment, and FIG. 3B is a diagram illustrating a neural network including an operation to be performed by the multi-bit operation device 30 of FIG. 3A.

Referring to FIG. 3A, the multi-bit operation device 30 may include a plurality of multi-bit cells connected in parallel and an electric power source (e.g., a voltage source or a current source) that applies a voltage or a current to the multi-bit cells. FIG. 3A illustrates only a number of components for describing the neural network of FIG. 3B, and other components that may be included in the multi-bit operation device 30 will be described below with reference to FIG. 12.

The multi-bit cells are included in the multi-bit operation device 30, and are unit circuits for receiving a multi-bit input. The number of multi-bit cells connected in parallel is not particularly limited, but may be, for example, $2^n$ (n is a natural number), and hereinafter, for convenience of description, a structure in which three multi-bit cells are connected in parallel will be described as an example.

Referring to FIG. 3B, a neural network having three nodes in a first layer and two nodes in a second layer is illustrated. The first layer may be one of the input layer and the hidden layers of FIG. 2. Nodes of the second layer may receive products of output values of the first layer and weights, have a result value obtained by inputting the products to activation functions, as node values, and provide the node values as inputs to a next layer. Specifically, in a first node $a_1$ of the second layer, three multiplication operations of each multiplying the output value of the first layer by the weight corresponding to each link, and an addition operation of accumulating a sum of resulting products may be performed, as shown in Equation 2 below, for example. Here, for convenience of description, a description of the activation functions will be omitted.

$$a_1 = X_1 \cdot W_{11} + X_2 \cdot W_{21} + X_3 \cdot W_{31} \qquad \text{Equation 2:}$$

The multi-bit operation device 30 illustrated in FIG. 3A is a device that may be used in the computation of Equation 2. Referring to FIG. 3A, a first multi-bit cell to a third multi-bit cell may have different resistance values with respect to the power source. The first multi-bit cell may correspond to the first node of the first layer, and similarly, the second multi-bit cell and the third multi-bit cell may correspond to a second node and a third node of the first layer, respectively.

The resistance values of the multi-bit cells with respect to the power source may be determined by inputs $X_1$, $X_2$, and $X_3$ and weights $W_{11}$, $W_{21}$, and $W_{31}$ applied to the respective multi-bit cells. The inputs and the weights may be multi-bit. Here, the input '$X_1$' refers to an output value or a node value of the first node (of the first layer), and is an input applied to the first multi-bit cell. Similarly, the input '$X_2$' and the input '$X_3$' refer to inputs or node values of the second node and the third node, respectively, and are inputs applied to the second multi-bit cell and the third multi-bit cell, respectively. In the weight '$W_{11}$', the left '1' refers to the first node of the first layer, and the right '1' refers to the first node of the second layer. The weight '$W_{11}$' refers to a weight with respect to a link between the first node of the first layer and the first node of the second layer, and is applied to the first multi-bit cell. Similarly, the weight '$W_{21}$' and the weight '$W_{31}$' refer to weights applied to the second multi-bit cell and the third multi-bit cell, respectively.

Figure 4:
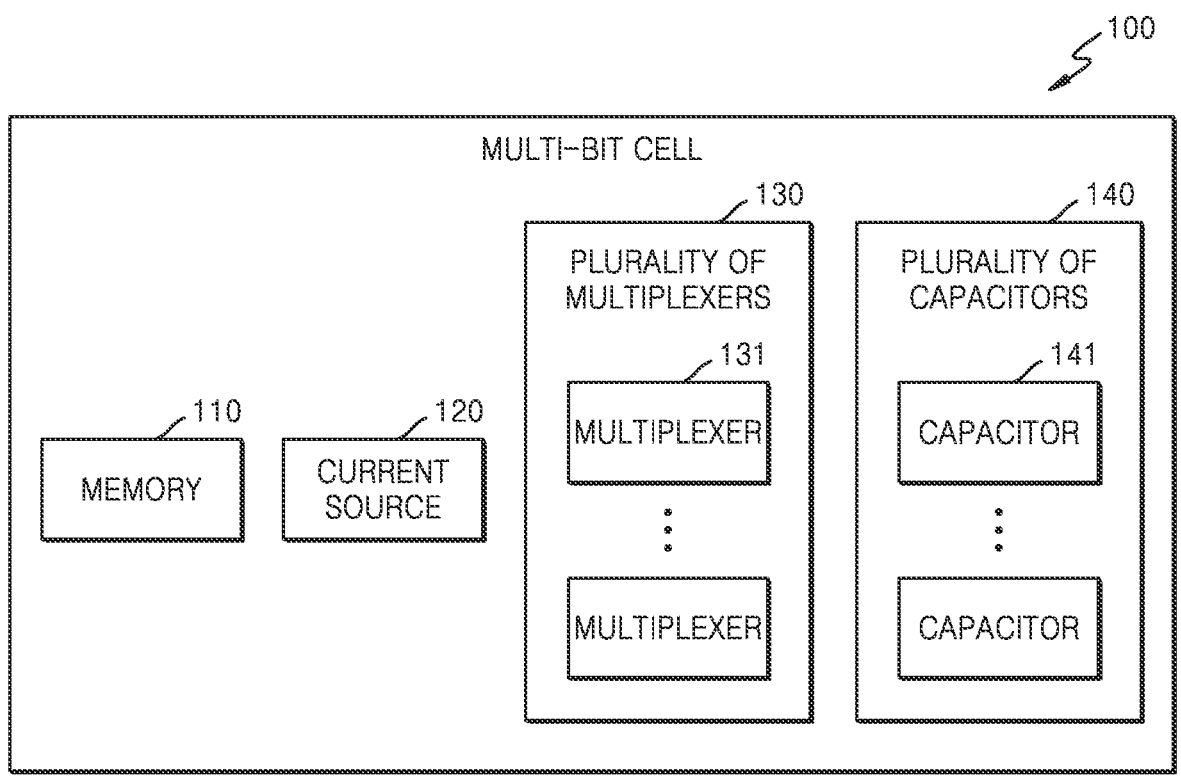
FIG. 4 is a block diagram illustrating a configuration of a multi-bit cell according to one or more embodiments.

FIG. 4 is a block diagram illustrating a configuration of a multi-bit cell (e.g., a multi-bit cell 100) according to one or more embodiments.

Referring to FIG. 4, the multi-bit cell 100 may include a memory 110, a current source 120, a plurality of multiplexers 130, and a plurality of capacitors 140. In the multi-bit cell 100 illustrated in FIG. 4, components related to the present embodiments are illustrated. Therefore, it will be understood to those of skill in the art, after an understanding of the present disclosure, that the multi-bit cell 100 may further include other general-purpose components in addition to the components illustrated in FIG. 4, in non-limiting examples.

The memory 110 may store a multi-bit weight in the form of a resistance. The multi-bit weight stored in the memory 110 in the form of a resistance is referred to as a weight resistance. When a multi-bit weight is 3 and a resistance corresponding to the multi-bit weight of 3 is 12 kΩ, the memory 110 may store the multi-bit weight of 3, in the form of a weight resistance of 12 kΩ. For example, the memory 110 may be a non-volatile memory, and may correspond to a resistive random-access memory (ReRAM), a phase-change memory (PCM), a magnetic RAM (MRAM), or the like. However, the types of the memory 110 described above is merely exemplary, and may be any type of memory capable of storing resistance information.

The current source 120 may apply a current to the memory 110. The current source 120 may apply a current having a constant magnitude to the memory 110 regardless of the magnitude of a resistance or a voltage. For example, the current source 120 may apply a direct-current bias current that sets an operating point of the multi-bit cell 100. Although the current source 120 applies currents having the same magnitude to the memory 110, the voltage of the memory 110 may vary according to the resistance of the memory 110. As the current source 120 applies a current to the memory 110, a weight voltage may be generated from the weight resistance stored in the memory 110. The weight voltage may be generated as the weight resistance is multiplied by the current according to Ohm's law. A non-limiting example of the weight voltage will be described in greater detail below with reference to FIG. 5.

The multi-bit cell 100 may receive a multi-bit input. The multi-bit input may include a plurality of inputs, unlike a 1-bit input expressed only by 1 or 0. For example, the multi-bit input may be composed of values of each digit representing the multi-bit input. When the multi-bit input is a 3-bit input, the multi-bit input may be expressed as, for example, '3'b101', that is composed of '1' at the position corresponding to $2^2$, '0' at the position corresponding to $2^1$, and '1' at the position corresponding to $2^0$. In this case, '1', '0', and '1' may correspond to values of the respective inputs included in the multi-bit input. The numbers of bits of the multi-bit weight and the multi-bit input may be equal to each other.

The plurality of multiplexers 130 may be connected to the memory 110 in series to receive the weight voltage and receive a fixed voltage through another line. The fixed voltage may be a voltage having a constant magnitude that is fixedly applied to a multiplexer 131. Also, the multiplexer 131 may receive one of the plurality of inputs constituting the multi-bit input. The multiplexer 131 may output one of the weight voltage and the fixed voltage based on the received input. For example, the multiplexer 131 may output the weight voltage in response to reception of 1, and output the fixed voltage in response to reception of 0. Non-limiting examples of this will be described in greater detail below with reference to FIG. 5. Alternatively, the multiplexer 131 may receive a plurality of fixed voltages and output one of the weight voltage and the plurality of fixed voltages based on a plurality of inputs. The multiplexer 131 may output one signal and may transmit the signal to a capacitor 141.

A plurality of multiplexers 130 may be connected to each other in parallel. The plurality of multiplexers 130 may be connected to the memory 110 in series, and may receive the same signal (the weight voltage or the fixed voltage). The plurality of multiplexers 130 may receive the multi-bit input, and respectively output one of the weight voltage and the fixed voltage based on the multi-bit input. A signal output by each multiplexer from among the weight voltage and the fixed voltage may be determined according to the value of the received input. For example, when the multi-bit input is '3'b101', the multiplexer that received '1' at the position corresponding to $2^2$ and the multiplexer that received '1' at the position corresponding to $2^0$ may output the same signal, and the multiplexer that received '0' at the position corresponding to $2^1$ may output a different signal.

The capacitor 141 may be connected to the multiplexer 131 to receive the signal output from the multiplexer 131. The capacitor 141 may store a weight capacitance. The capacitor 141 may generate zero-charge data by performing an operation on the received signal and the weight capacitance. The operation by the capacitor 141 will be described in detail with reference to FIG. 5.

A plurality of capacitors 140 may be connected to each other in parallel. Each of the plurality of capacitors 140 may be connected to each of the plurality of multiplexers 130 in series. Accordingly, one capacitor 141 may be connected to one multiplexer 131. Each of the plurality of capacitors 140 may store a respective weight capacitance. The weight capacitances may be different from each other, may be equal to each other, or only some of them may be different from each other.

Figure 5:
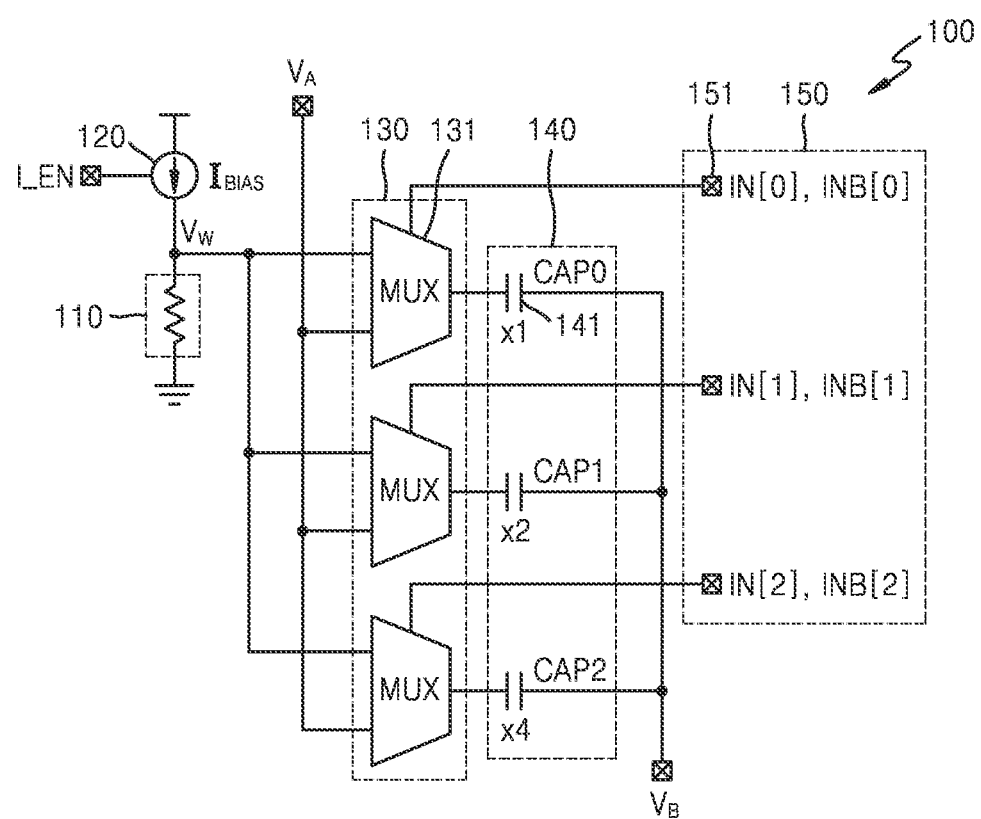
FIG. 5 is a circuit diagram of a multi-bit cell according to one or more embodiments.

FIG. 5 is a circuit diagram of a multi-bit cell (e.g., the multi-bit cell 100) according to one or more embodiments.

Referring to FIG. 5, the multi-bit cell 100 may include the memory 110, the current source 120, the plurality of multiplexers 130, and the plurality of capacitors 140. The multi-bit cell 100 may receive a multi-bit input 150, and an individual input 151 included in the multi-bit input 150 may be input to each multiplexer 131.

In the circuit diagram of FIG. 5, only components related to the present embodiments are illustrated. Therefore, it is obvious to those of skill in the art that other general-purpose components may be further included in the circuit diagram in addition to the components illustrated in FIG. 5.

Referring to the circuit diagram of FIG. 5, the weight voltage and a first fixed voltage may be input to the multiplexer 131. In addition, the multiplexer 131 may receive the individual input 151 constituting the multi-bit input 150. The individual input 151 received by the multiplexer 131 may act as a selector signal (SEL) with respect to the multiplexer 131, to cause one of the weight voltage and the first fixed voltage to be output from the multiplexer 131.

One signal output from the multiplexer 131 may be transmitted to the capacitor 141. The one signal output from the multiplexer 131 may be transmitted to the left terminal of the capacitor 141, and a second fixed voltage may be transmitted to the right terminal of the capacitor 141. Accordingly, a voltage having a potential difference between the one signal output from the multiplexer 131 and the second fixed voltage may be applied to the capacitor 141.

Hereinafter, a method of performing an operation on the multi-bit input 150 and the multi-bit weight will be described in detail.

The memory 110 may store weight resistances respectively corresponding to multi-bit weights. The value of a weight resistance may vary depending on the value of a corresponding multi-bit weight. The weight resistance may be set to linearly increase as the corresponding multi-bit weight increases. For example, the weight resistance may increase by a constant difference as the corresponding multi-bit weight increases by a constant difference, like an arithmetic progression. An example of weight resistances for 3-bit weights is shown in Table 1.

TABLE 1

| Multi-bit weight | Weight resistance (kΩ) |
|---|---|
| −7 | 7 |
| −5 | 8 |
| −3 | 9 |
| −1 | 10 |
| 1 | 11 |
| 3 | 12 |
| 5 | 13 |
| 7 | 14 |

The multi-bit cell 100 may generate the weight voltage from the weight resistance by applying a current to the memory 110 by using the current source 120. When the current is applied to the weight resistance stored in the memory 110, the current is multiplied by the weight resistance according to Ohm's law, and as a result, the weight voltage may be generated. Because the current source 120 outputs a current having a constant magnitude, the weight voltage may be proportional to the weight resistance. An example of weight voltages for the 3-bit weights is shown in Table 2.

TABLE 2

| Multi-bit weight | Weight resistance (kΩ) | Current (uA) | Weight voltage (mV) |
|---|---|---|---|
| −7 | 7 | 50 | 350 |
| −5 | 8 | 50 | 400 |
| −3 | 9 | 50 | 450 |
| −1 | 10 | 50 | 500 |
| 1 | 11 | 50 | 550 |
| 3 | 12 | 50 | 600 |
| 5 | 13 | 50 | 650 |
| 7 | 14 | 50 | 700 |

The multi-bit cell 100 may receive the multi-bit input 150 by using the plurality of capacitors 140 that receive respective 1-bit inputs 151. The number of capacitors 140 and the weight capacitances may be set to enable reception of the multi-bit input 150.

For example, the multi-bit cell 100 may include a number of capacitors 141 such that the number corresponds to the number of bits of the multi-bit input 150, and each of the capacitors 141 may store a weight capacitance of a value corresponding to the position of each digit of the multi-bit input 150. When the multi-bit input 150 is 3-bit, the multi-bit input 150 may be expressed as '3'b000' to '3'b111', and the factors to be respectively multiplied by the digits of the multi-bit input 150 may be $2^0$, $2^1$, and $2^2$. In this case, the multi-bit cell 100 may include three capacitors 140, and the capacitors 140 may store a weight capacitance of $2^0$ times a unit capacitance, a weight capacitance of $2^1$ times the unit capacitance, and a weight capacitance of $2^2$ times the unit capacitance, respectively. Referring to FIG. 5, the multi-bit input 150, that is 3-bit, is applied, and the three capacitors 140 store weight capacitances of 1, 2, and 4 times the unit capacitance, respectively.

The capacitors 140 may indirectly receive the multi-bit input 150 via the multiplexers 130. As described above, the multi-bit input 150 may include a plurality of inputs, and each input may be received by the multiplexer connected to the corresponding capacitor. The value of each digit constituting the multi-bit input 150 may be input to the multiplexer connected to the capacitor corresponding to the position of the digit. For example, when the multi-bit input 150 is 3-bit, the value of the digit corresponding to $2^0$ of the multi-bit input 150 may be indirectly input to a capacitor CAP0 that stores the capacitance weight of 1 times the unit capacitance, the value of the digit corresponding to $2^1$ of the multi-bit input 150 may be indirectly input to a capacitor CAP1 that stores the capacitance weight of 2 times the unit capacitance, and the value of the digit corresponding to $2^2$ of the multi-bit input 150 may be indirectly input to a capacitor CAP2 that stores the capacitance weight of 4 times the unit capacitance. The value of each position of the multi-bit input 150 may be directly input to the multiplexer and the signal output from the multiplexer may be transmitted to the capacitor based on the input, and thus the value of each position may be indirectly input to the capacitor.

When the multi-bit input 150 is '3'b110' (i.e., 6), '1' may be input to the multiplexer corresponding to the capacitor CAP2, '1' may be input to the multiplexer corresponding to the capacitor CAP1, and '0' may be input to the multiplexer corresponding to the capacitor CAP0. An example of values input to the respective multiplexers according to a value of the multi-bit input 150, that is 3-bit, is shown in Table 3.

TABLE 3

| Multi-bit input | MUX - CAP2(×4) | MUX - CAP1(×2) | MUX - CAP0(×1) |
|---|---|---|---|
| 4 | 1 | 0 | 0 |
| 4 | 1 | 0 | 0 |
| 2 | 0 | 1 | 0 |
| 7 | 1 | 1 | 1 |
| 2 | 0 | 1 | 0 |
| 1 | 0 | 0 | 1 |
| 0 | 0 | 0 | 0 |
| 0 | 0 | 0 | 0 |
| 1 | 0 | 0 | 1 |
| 5 | 1 | 0 | 1 |
| 0 | 0 | 0 | 0 |
| 4 | 1 | 0 | 0 |
| 1 | 0 | 0 | 1 |
| 1 | 0 | 0 | 1 |
| 6 | 1 | 1 | 0 |
| 3 | 0 | 1 | 1 |

As described above, each of the multiplexers 130 may receive an input of 1 or 0. Among the multiplexers 130, the multiplexer that received an input of '1' may output the weight voltage, and the multiplexer that received an input of '0' may output the first fixed voltage. However, this is merely an example, and the multiplexer may be variously modified and implemented such that, for example, the multiplexer is configured to operate in a manner opposite to the example, the multiplexer receives different types of inputs, or the multiplexer determines a signal to be output based on a plurality of inputs. An example of signals transmitted from the multiplexers 130 to the respective capacitors according to the example of Table 3 is shown in Table 4.

TABLE 4

| Multi-bit input | CAP2(×4) | CAP1(×2) | CAP0(×1) |
|---|---|---|---|
| 4 | Weight voltage | First fixed voltage | First fixed voltage |
| 4 | Weight voltage | First fixed voltage | First fixed voltage |
| 2 | First fixed voltage | Weight voltage | First fixed voltage |
| 7 | Weight voltage | Weight voltage | Weight voltage |
| 2 | First fixed voltage | Weight voltage | First fixed voltage |
| 1 | First fixed voltage | First fixed voltage | Weight voltage |
| 0 | First fixed voltage | First fixed voltage | First fixed voltage |
| 0 | First fixed voltage | First fixed voltage | First fixed voltage |
| 1 | First fixed voltage | First fixed voltage | Weight voltage |
| 5 | Weight voltage | First fixed voltage | Weight voltage |
| 0 | First fixed voltage | First fixed voltage | First fixed voltage |
| 4 | Weight voltage | First fixed voltage | First fixed voltage |
| 1 | First fixed voltage | First fixed voltage | Weight voltage |
| 1 | First fixed voltage | First fixed voltage | Weight voltage |
| 6 | Weight voltage | Weight voltage | First fixed voltage |
| 3 | First fixed voltage | Weight voltage | Weight voltage |

One terminal of the capacitor 141 may receive the signal output from the multiplexer 131, and the opposite terminal of the capacitor 141 may receive the second fixed voltage. The capacitor 141 may perform a subtraction operation of the second fixed voltage with respect to the signal output from the multiplexer 131. Accordingly, the capacitor 141 may perform a subtraction operation of the second fixed voltage with respect to the weight voltage or the first fixed voltage. A difference value may be a potential difference between both terminals of the capacitor 141, and may correspond to a voltage applied to the capacitor 141. For example, when the first fixed voltage is set to have the same value as the second fixed voltage, the difference value of the second fixed voltage with respect to the first fixed voltage may correspond to 0 V. However, the first fixed voltage and the second fixed voltage may be set to different values according to the structure and configuration of the multi-bit cell 100, and in this case, the difference value may correspond to a value other than 0 V.

The magnitude of the second fixed voltage may be set such that the difference value with the weight voltage is proportional to the multi-bit weight. In the example of Table 2, the second fixed voltage may be 525 mV that is the average of the weight voltages. The relationships between the weight voltages, the second fixed voltages, and the difference values of the second fixed voltages with respect to the weight voltages are summarized in Table 5.

TABLE 5

| Multi-bit weight | Weight voltage (mV) | Second fixed voltage (mV) | Difference values (mV) |
|---|---|---|---|
| −7 | 350 | 525 | −175 |
| −5 | 400 | 525 | −125 |
| −3 | 450 | 525 | −75 |
| −1 | 500 | 525 | −25 |
| 1 | 550 | 525 | 25 |
| 3 | 600 | 525 | 75 |
| 5 | 650 | 525 | 125 |
| 7 | 700 | 525 | 175 |

As shown in Table 5, the magnitude of the second fixed voltage may be set such that the difference value is proportional to the multi-bit weight. In the example of Table 5, the first fixed voltage may also be set to be the same as the second fixed voltage.

Table 6 shows the multi-bit input 150, the multi-bit weight, the weight voltage according to the multi-bit weight, and the difference value of the second fixed voltage with respect to the weight voltage, that are set for each of a plurality of multi-bit cells 100 according to the example of Table 2.

TABLE 6

| Row | Multi-bit input | Multi-bit weight | Weight voltage (mV) | Difference value (mV) |
|---|---|---|---|---|
| 1 | 4 | −1 | 500 | −25 |
| 2 | 4 | −1 | 500 | −25 |
| 3 | 2 | 1 | 550 | 25 |
| 4 | 7 | 7 | 700 | 175 |
| 5 | 2 | 3 | 600 | 75 |
| 6 | 1 | −1 | 500 | −25 |
| 7 | 0 | 3 | 600 | 75 |
| 8 | 0 | −5 | 400 | −125 |
| 9 | 1 | 1 | 550 | 25 |
| 10 | 5 | 7 | 700 | 175 |
| 11 | 0 | −1 | 500 | −25 |
| 12 | 4 | −5 | 400 | −125 |
| 13 | 1 | 3 | 600 | 75 |
| 14 | 1 | 7 | 700 | 175 |
| 15 | 6 | −7 | 350 | −175 |
| 16 | 3 | 3 | 600 | 75 |

The values of the multi-bit inputs 150 and the multi-bit weights shown in Table 6 are arbitrarily set based on 3-bit inputs, and may be variously modified. One row of Table 6 may correspond to one multi-bit cell 100. Thus, in Table 6, the configurations for 16 multi-bit cells 100 are shown.

The first fixed voltage may be set to be equal to the second fixed voltage, and thus, among the capacitors 140, the capacitor that receives the first fixed voltage may have the same potential at both terminals thereof and thus a potential difference of 0 V. In this case, the capacitor may receive a voltage of 0 V and generate charge data of 0 C.

Table 7 shows difference values obtained by the respective capacitors of each of the multi-bit cells 100, i.e., potential differences between both terminals of the respective capacitors according to the examples of the tables above.

TABLE 7

| Row | Multi-bit input | Multi-bit weight | Difference value (mV) | | |
|---|---|---|---|---|---|
| | | | CAP2(×4) | CAP1(×2) | CAP0(×1) |
| 1 | 4 | −1 | −25 | 0 | 0 |
| 2 | 4 | −1 | −25 | 0 | 0 |
| 3 | 2 | 1 | 0 | 25 | 0 |
| 4 | 7 | 7 | 175 | 175 | 175 |
| 5 | 2 | 3 | 0 | 75 | 0 |
| 6 | 1 | −1 | 0 | 0 | −25 |
| 7 | 0 | 3 | 0 | 0 | 0 |
| 8 | 0 | −5 | 0 | 0 | 0 |
| 9 | 1 | 1 | 0 | 0 | 25 |
| 10 | 5 | 7 | 175 | 0 | 175 |
| 11 | 0 | −1 | 0 | 0 | 0 |
| 12 | 4 | −5 | −125 | 0 | 0 |
| 13 | 1 | 3 | 0 | 0 | 75 |
| 14 | 1 | 7 | 0 | 0 | 175 |
| 15 | 6 | −7 | −175 | −175 | 0 |
| 16 | 3 | 3 | 0 | 75 | 75 |

The capacitor 141 may generate charge data by multiplying the difference value by the weight capacitance. That is, the capacitor 141 may generate the charge data by multiplying the weight capacitance by the difference value (voltage) according to an equation of Q=C×V.

Table 8 shows charge data generated by each capacitor according to the example of Table 7.

TABLE 8

| Row | Multi-bit input | Multi-bit weight | Charge data (Q = C × V, $C_{UNIT}$ = 1 F) (mC) | | |
|---|---|---|---|---|---|
| | | | CAP2(×4) | CAP1(×2) | CAP0(×1) |
| 1 | 4 | −1 | −100 | 0 | 0 |
| 2 | 4 | −1 | −100 | 0 | 0 |
| 3 | 2 | 1 | 0 | 50 | 0 |
| 4 | 7 | 7 | 700 | 350 | 175 |
| 5 | 2 | 3 | 0 | 150 | 0 |
| 6 | 1 | −1 | 0 | 0 | −25 |
| 7 | 0 | 3 | 0 | 0 | 0 |
| 8 | 0 | −5 | 0 | 0 | 0 |
| 9 | 1 | 1 | 0 | 0 | 25 |
| 10 | 5 | 7 | 700 | 0 | 175 |
| 11 | 0 | −1 | 0 | 0 | 0 |
| 12 | 4 | −5 | −500 | 0 | 0 |
| 13 | 1 | 3 | 0 | 0 | 75 |
| 14 | 1 | 7 | 0 | 0 | 175 |
| 15 | 6 | −7 | −700 | −350 | 0 |
| 16 | 3 | 3 | 0 | 150 | 75 |

The multi-bit cell 100 may output first summed data generated by summing up charge data generated by each of the capacitors 140. In the example of Table 8, the multi-bit cell 100 corresponding to Row 1 may output the first summed data of −100 mC, and the multi-bit cell 100 corresponding to Row 4 may output the first summed data of 1,225 mC. The first summed data of each row may be converted into a digital signal after the charge data is summed up. A non-limiting example of this will be described below with reference to FIG. 12.

Meanwhile, the operating method of the multi-bit cell 100 may be verified by comparing the result of multiplication of the multi-bit input 150 and the multi-bit weight, with the first summed data. The product of the multi-bit input 150 and the multi-bit weight of Row 1 is −4, and the product of the multi-bit input 150 and the multi-bit weight of Row 4 is 49. Referring to Table 5, it may be confirmed that the difference values of the second fixed voltages with respect to the weight voltages are 25 times the multi-bit inputs 150, respectively. Here, because the first summed data of Row 1 is (−4×25) mC and the first summed data of Row 4 is (49×25) mC, it is confirmed that the first summed data corresponds to the result of multiplication described above.

Thus, the multi-bit cell 100 may perform a multi-bit operation by receiving the multi-bit input 150 through the plurality of capacitors 140 storing respective capacitance weights and converting the multi-bit weight to the voltage weight without directly multiplying the multi-bit input 150 by the multi-bit weight.

Figure 6:
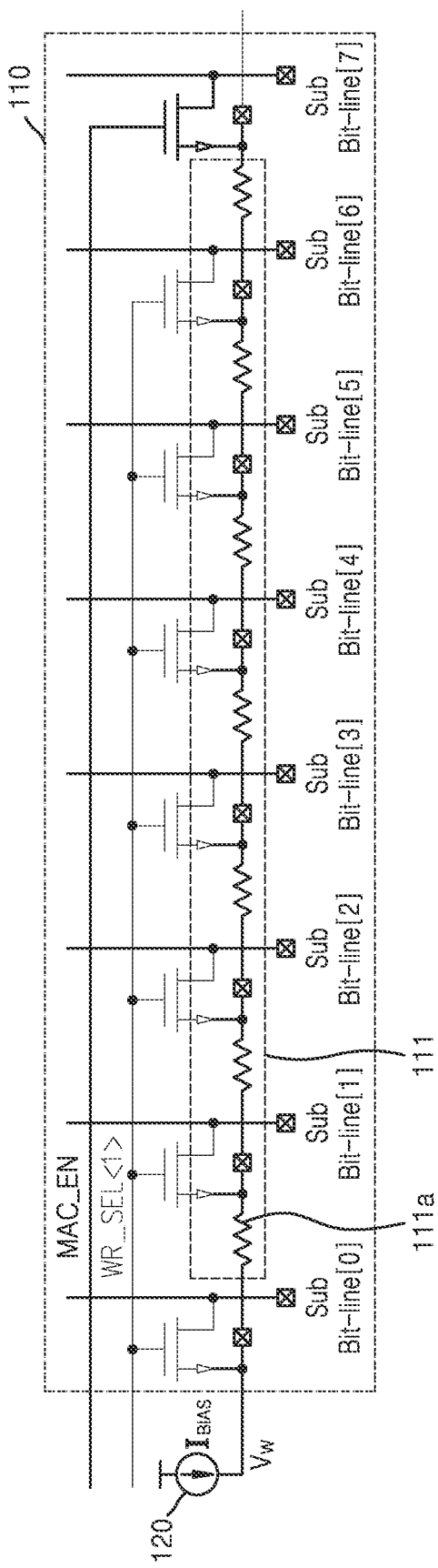
FIG. 6 is a circuit diagram of a memory according to one or more embodiments.

FIG. 6 is a circuit diagram of a memory (e.g., the memory 110) according to one or more embodiments.

Referring to FIG. 6, the memory 110 may include a plurality of resistive elements 111.

The memory 110 may include a number of resistive elements 111 such that the number corresponds to the number of bits of the multi-bit weight. For example, when the multi-bit weight is N-bit, the memory 110 may include ($2^N$−1) resistive elements 111. In the embodiment of FIG. 6, the multi-bit weight may be 3-bit, and the memory 110 may include ($2^3$−1), that is, seven resistive elements 111.

The resistive elements 111 may be connected to each other in series. Because the resistive element 111a may indicate 0 in an ON state, and a certain resistance value in an OFF state, the memory 110 may be configured to have $2^N$ resistance values by using $2^N$−1 resistive elements 111 connected in series. The multi-bit cell 100 may adjust the weight resistance by controlling ON/OFF of each of the resistive elements 111. The multi-bit cell 100 may determine the ON/OFF of each resistive element by using a signal WR SEL, and may apply a current or a voltage to each resistive element through signal lines Sub Bit-line[0] to Sub Bit-line [7].

For example, when the correspondences between the multi-bit weights and the weight resistances are as shown in the example of Table 1, one resistive element may store a resistance of 7 kΩ and the other resistive elements may store a resistance of 1 kΩ, or each of the resistive elements may store a resistance of 1 kΩ or 2 kΩ. The multi-bit cell 100 may store a weight resistance of any one of 7 kΩ, 8 kΩ, . . . , 13 kΩ, and 14 kΩ in the memory 110 by controlling the ON/OFF of each of the resistive elements 111 connected in series. Accordingly, a weight resistance from 7 kΩ to 14 kΩ may be indicated by the memory 110 in units of 1 kΩ.

The resistive element 111a may correspond to a magnetic tunnel junction (MTJ) or magnetoresistive random-access memory (MRAM). However, this is merely an example, and the resistive element may correspond to any device that stores a resistance and is controlled by a transistor, without limitation.

Figure 7:
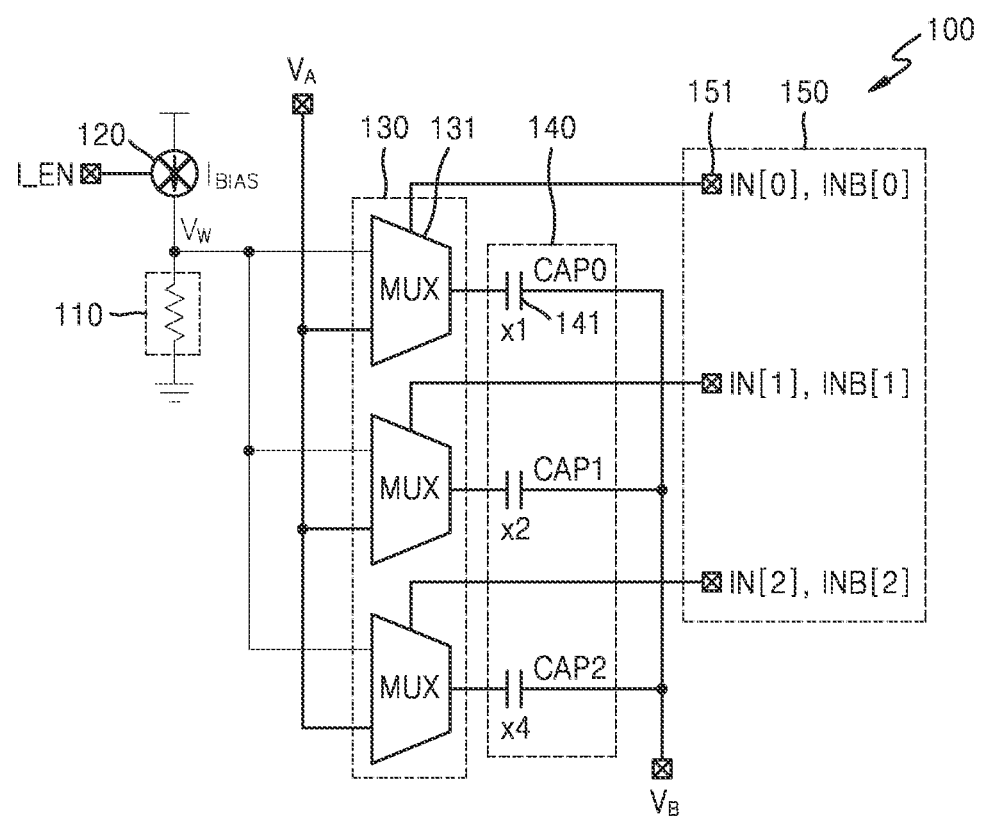
FIG. 7 is a circuit diagram of a multi-bit cell in which a first fixed voltage is output from all of multiplexers, according to one or more embodiments.

FIG. 7 is a circuit diagram of a multi-bit cell (e.g., the multi-bit cell 100) in which the first fixed voltage is output from all of multiplexers (e.g., the multiplexers 130), according to one or more embodiments.

Referring to FIG. 7, when the weight voltage is not used in the multi-bit cell 100, the current source 120 may be disabled and only the first fixed voltage may be applied to the multiplexers 130.

For example, when the multi-bit input 150 is 0, the weight voltage is not used in the multi-bit cell 100, and only the first fixed voltage may be applied to the multiplexers 130. The case where the multi-bit input 150 is 0 means that all of the individual inputs 151 constituting the multi-bit input 150 are 0. When the multi-bit input 150 is 3-bit, the multi-bit input 150 of 0 may be expressed as '3'b000'. An input of 0 may be received by all of the multiplexers 130. The multiplexers 130 may output the first fixed voltage in response to the input of 0. Because the weight voltage is not transmitted to the capacitors 140, the current source 120 for generating a weight voltage does not need to operate. Accordingly, the multi-bit cell 100 may reduce its power consumption by disabling the current source 120. For example, the multi-bit cell 100 may control the current applied from the current source 120 to be 0 uA by using a signal I_EN that is an enable signal that controls the current source 120.

However, in various cases other than the case where the multi-bit input 150 is 0, all of the multiplexers 130 may output the first fixed voltage according to the structure and configuration of the multi-bit cell 100. When all of the multiplexers 130 output the first fixed voltage, because the weight voltage is not used in the multi-bit cell 100, the current source 120 may be turned off and the power consumption of the multi-bit cell 100 may be reduced.

Figure 8:
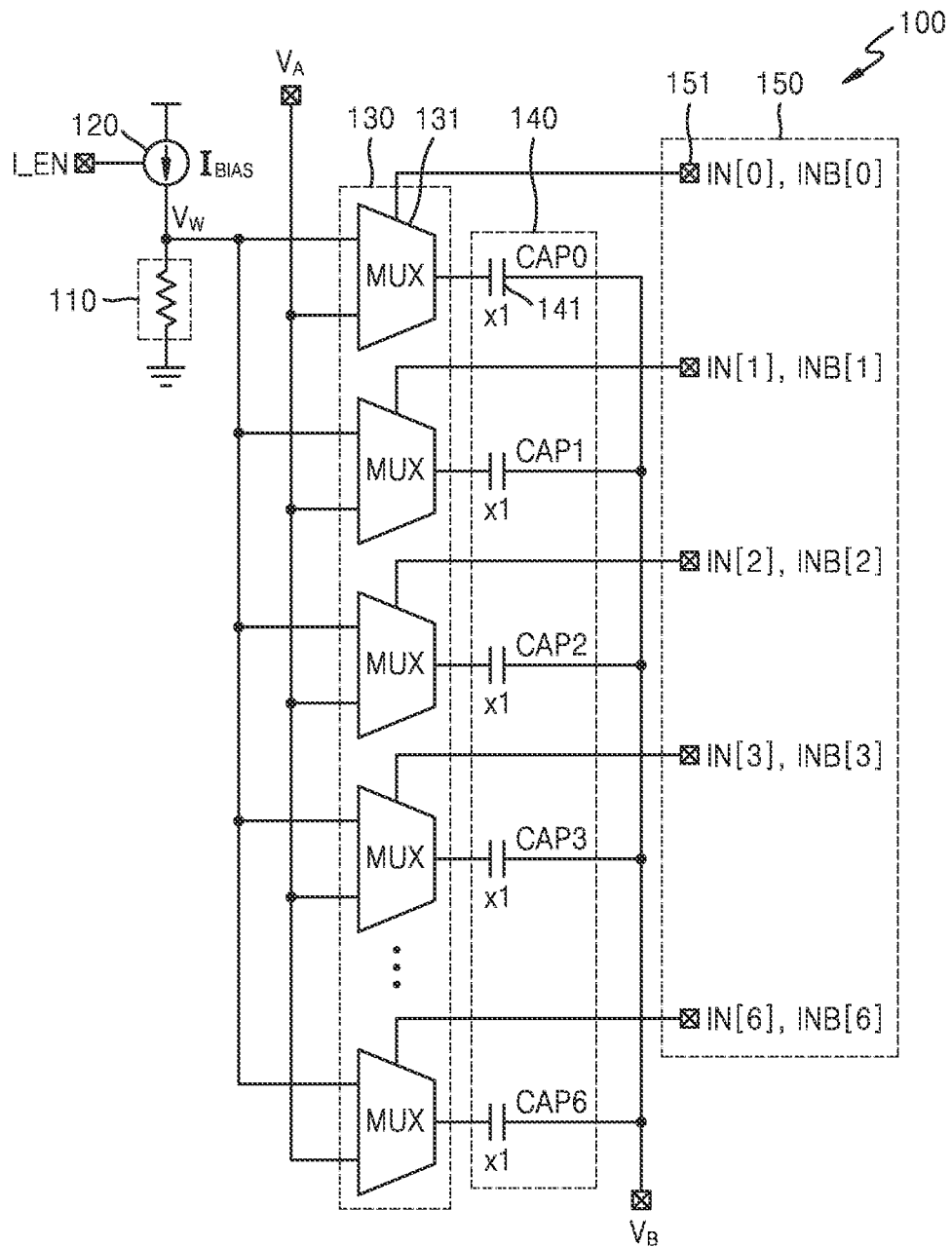
FIG. 8 is a circuit diagram of a multi-bit cell in which all of capacitors store a same weight capacitance, according to one or more embodiments.

FIG. 8 is a circuit diagram of a multi-bit cell (e.g., the multi-bit cell 100) in which all of capacitors (e.g., the capacitors 140) store the same weight capacitance, according to one or more embodiments.

Referring to FIG. 8, all of the capacitors 140 may store the weight capacitance equal to the unit capacitance.

The multi-bit cell 100 may include a number of capacitors 140 such that the number corresponds to the number of bits of the multi-bit input 150. For example, the multi-bit cell 100 may include $(2^N-1)$ capacitors 140 for the multi-bit input 150 that is N-bit. Here, all of the weight capacitances stored in the capacitors 140 may be equal to the unit capacitance. The $(2^N-1)$ capacitors 140 may receive the multi-bit input 150 having a value of 0 to $2^N-1$.

In the structure of the embodiment of FIG. 8, the multi-bit cell 100 may receive inputs in various formats. For example, the multi-bit cell 100 may receive inputs in various formats, such as a thermometer code input, a binary input, or a ternary input.

Figure 9:
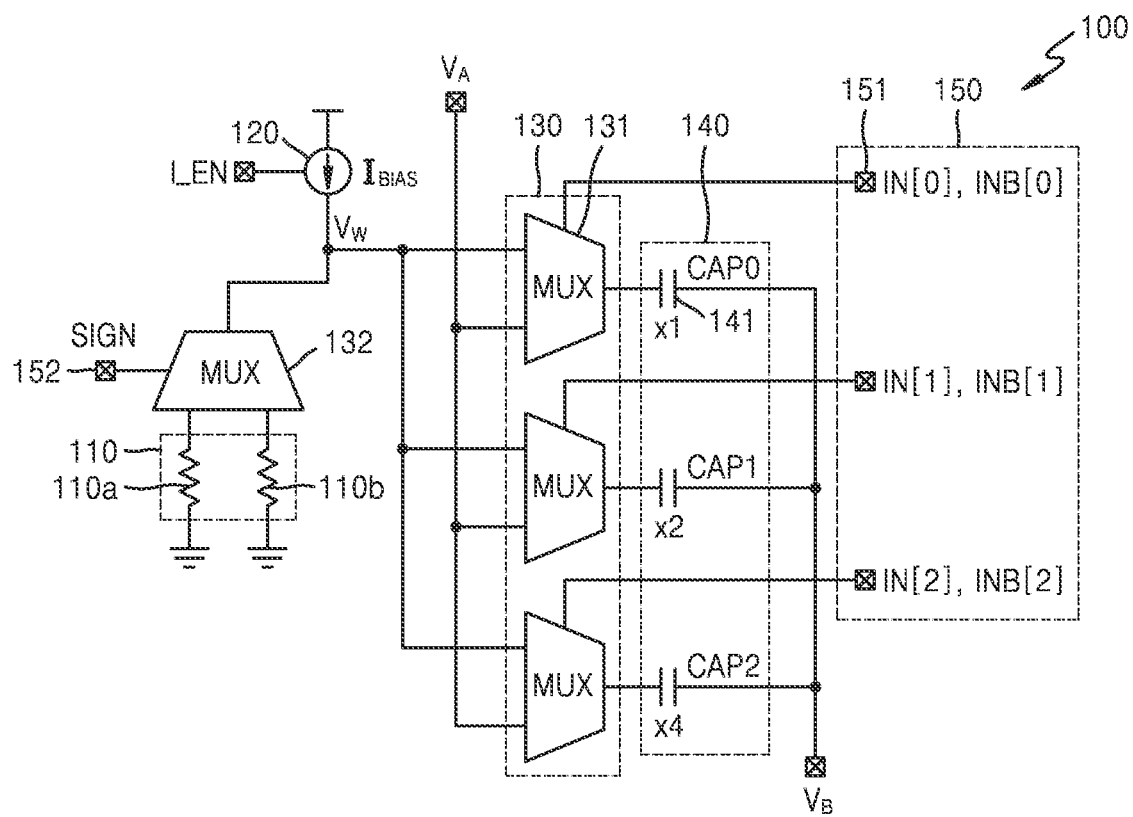
FIG. 9 is a circuit diagram of a multi-bit cell including a plurality of memories, according to one or more embodiments.

FIG. 9 is a circuit diagram of a multi-bit cell (e.g., the multi-bit cell 100) including a plurality of memories, according to one or more embodiments.

Referring to FIG. 9, the memory 110 may include a first memory 110a and a second memory 110b that store different weight resistances, and the multi-bit cell 100 may further include a sign multiplexer 132 that receives a sign input 152.

The weight resistances of the first memory 110a and the second memory 110b may be variously set, for example, to have the same absolute value with different signs or different values with the same sign. The sign multiplexer 132 may be connected to the first memory 110a and the second memory 110b. The multi-bit cell 100 may also receive the sign input 152 through the sign multiplexer 132, in addition to the multi-bit input 150. Based on the sign input 152, the sign multiplexer 132 may determine one memory 110 of the first memory 110a and the second memory 110b to which the current is to be applied from the current source 120. The sign multiplexer 132 may establish a line to connect the determined memory 110 to the current source 120 so as to apply the current to the determined memory 110. The multi-bit cell 100 may generate the weight voltage from the weight resistance stored in the memory 110 determined based on the sign input 152.

The multi-bit cell 100 may include the plurality of memories 110 storing different weight resistances, so as to receive more various inputs and perform operations on various weights. When the resistance weight of the first memory 110a is a positive number and the resistance weight of the second memory 110b is a negative number, the multi-bit cell 100 may receive a signed integer input and may perform an operation thereon.

Figure 10:
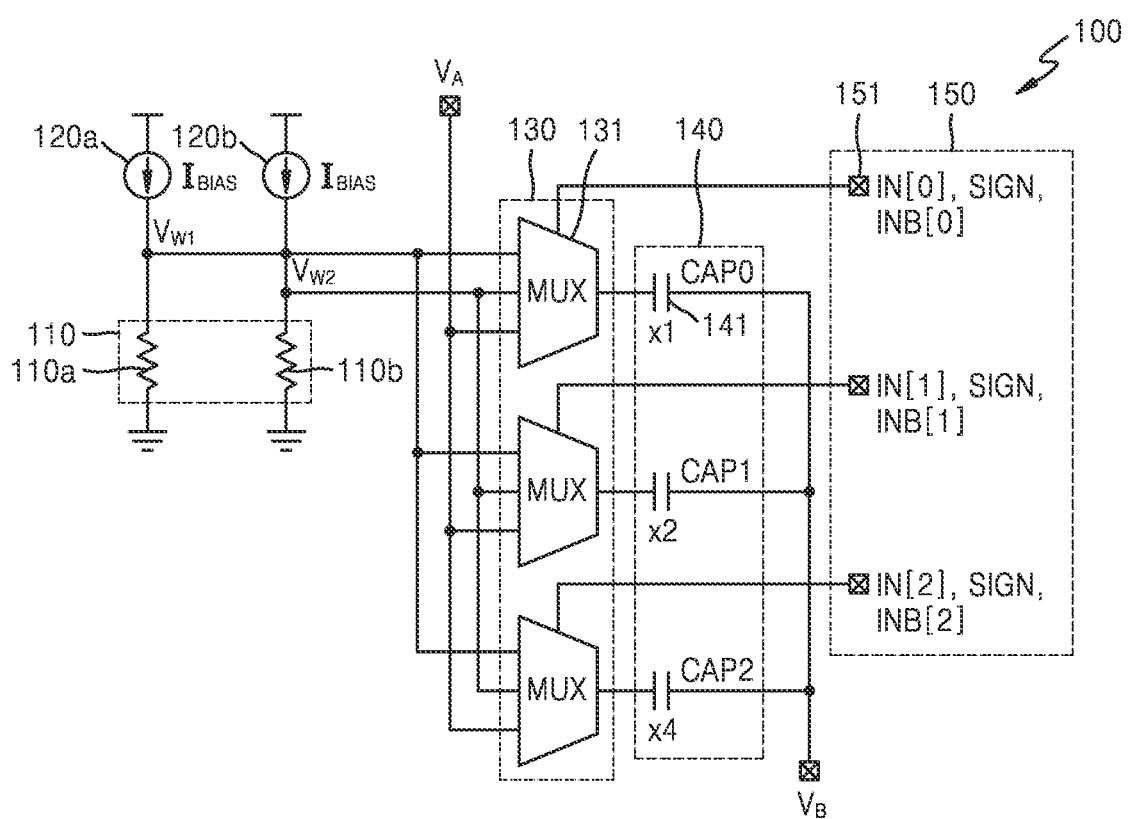
FIG. 10 is a circuit diagram of a multi-bit cell including a plurality of memories, according to one or more embodiments.

FIG. 10 is a circuit diagram of a multi-bit cell (e.g., the multi-bit cell 100) including the plurality of memories, according to one or more embodiments.

Referring to FIG. 10, the memory 110 may include the first memory 110a and the second memory 110b that store different weight resistances, and the current source 120 may include a first current source 120a that applies a current to the first memory 110a and a second current source 120b that applies a current to the second memory 110b. The multi-bit cell 100 may receive the multi-bit input 150 including a sign input.

The first memory 110a may store a first weight resistance, and the second memory 110b may store a second weight resistance. The first weight resistance and the second weight resistance may be variously set, for example, to have the same absolute value with different signs or different values with the same sign.

The first current source 120a and the second current source 120b may apply currents having the same magnitude. The first current source 120a may apply a current to the first memory 110a to generate a first weight voltage, and the second current source 120b may apply a current to the second memory 110b to generate a second weight voltage.

Each of the multiplexers 130 may output one of the first weight voltage, the second weight voltage, and the first fixed voltage based on the multi-bit input 150 including the sign input. For example, the multiplexer 131 may output the first fixed voltage in response to the absolute value of the input being 0, and may determine one of the first weight voltage and the second weight voltage based on the sign input in response to the absolute value of the input being 1.

The multi-bit cell 100 may include the plurality of memories 110 that store different weight resistances to receive more various inputs and perform operations on various weights. When the resistance weight of the first memory 110a is a positive number and the resistance weight of the second memory 110b is a negative number, the multi-bit cell 100 may receive a signed integer input and may perform an operation thereon.

Figure 11:
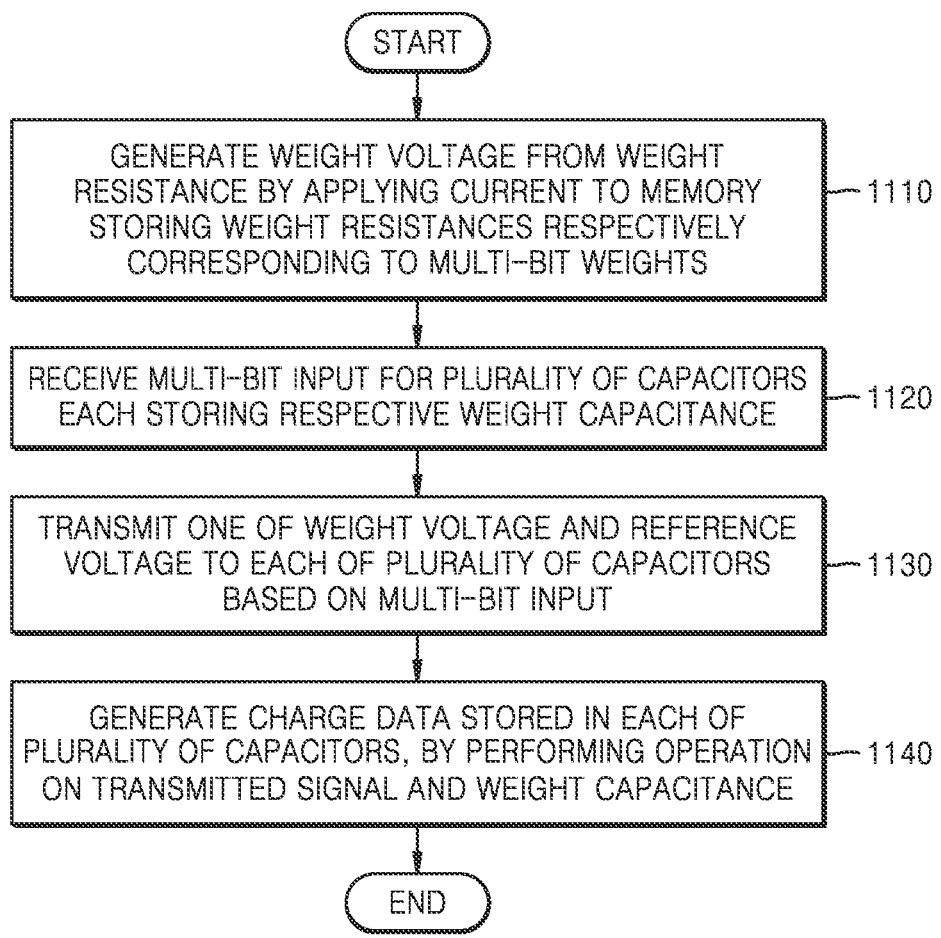
FIG. 11 is a flowchart illustrating an operating method of a multi-bit cell, according to one or more embodiments.

FIG. 11 is a flowchart illustrating an operating method of a multi-bit cell (e.g., the multi-bit cell), according to one or more embodiments.

Referring to FIG. 11, the operating method of the multi-bit cell includes operations that are processed in a time series by the multi-bit cell illustrated in FIG. 4. Accordingly, it may be seen that the information described above regarding the multi-bit cell with reference to FIGS. 4 to 10 also applies to the method of FIG. 11 even if it is omitted below.

In operation 1110, the multi-bit cell may generate the weight voltage from the weight resistance by applying a current to the memory storing the weight resistances respectively corresponding to the multi-bit weights.

The memory may include a number of resistive elements connected to each other in series such that the number corresponds to the number of bits of the multi-bit weight. The multi-bit cell may adjust the weight resistance by controlling the ON/OFF of each of the resistive elements.

The weight resistance may be set to linearly increase as the corresponding multi-bit weight increases.

In operation 1120, the multi-bit cell may receive a multi-bit input for the plurality of capacitors each storing the respective weight capacitance.

The value of each digit constituting the multi-bit input 150 may be input to the multiplexer connected to the capacitor corresponding to the position of the digit.

In operation 1130, the multi-bit cell may transmit one of the weight voltage and a reference voltage to each of the plurality of capacitors based on the multi-bit input.

Each of the plurality of multiplexers may receive an input of 1 or 0, and among the plurality of multiplexers, the multiplexer that received 1 may output the weight voltage, and the multiplexer that received 0 may output the first fixed voltage.

When the multi-bit input is 0, all of the plurality of multiplexers may output the first fixed voltage, and the multi-bit cell may reduce its power consumption by turning off the current source.

The magnitude of the second fixed voltage transmitted to a terminal opposite to the other terminal of the capacitor to which an output signal is transmitted may be the same as the magnitude of the first fixed voltage, and the magnitude of the second fixed voltage may be set such that the difference value with the weight voltage is proportional to the multi-bit weight.

The multi-bit cell may include a number of capacitors such that the number corresponds to the number of bits of the multi-bit input, and each of the capacitors may store a weight capacitance of a value corresponding to the position of each digit of the multi-bit input.

In operation 1140, the multi-bit cell may generate charge data that is stored in each of the plurality of capacitors, by performing an operation on the transmitted signal and the weight capacitance.

Among the plurality of capacitors, the capacitor that receives the first fixed voltage may receive a voltage of 0 V because the potentials at its both terminals are the same, and may generate charge data of 0 C.

Each of the plurality of capacitors may receive the output signal at one terminal thereof, receive the second fixed voltage at the opposite terminal thereof, perform a subtraction operation of the second fixed voltage with respect to the output signal, and multiply the difference value by the weight capacitance to generate the charge data.

The multi-bit cell may output the first summed data generated by summing up the charge data generated by each of the plurality of capacitors.

In an embodiment, the memory may include the first memory and the second memory that store different weight resistances The multi-bit cell may further include the sign multiplexer that determines, based on a sign input, one memory of the first memory and the second memory to which a current is to be applied. The multi-bit cell may generate the weight voltage from the weight resistance stored in the determined memory.

In another embodiment, the memory may include the first memory storing the first weight resistance and the second memory storing the second weight resistance. The current source may include the first current source and the second current source that apply currents having the same magnitude. The first current source may apply a current to the first memory to generate the first weight voltage, and the second current source may apply a current to the second memory to generate the second weight voltage. Each of the plurality of multiplexers may output one of the first weight voltage, the second weight voltage, and the first fixed voltage, based on the multi-bit input including the sign input.

Figure 12:
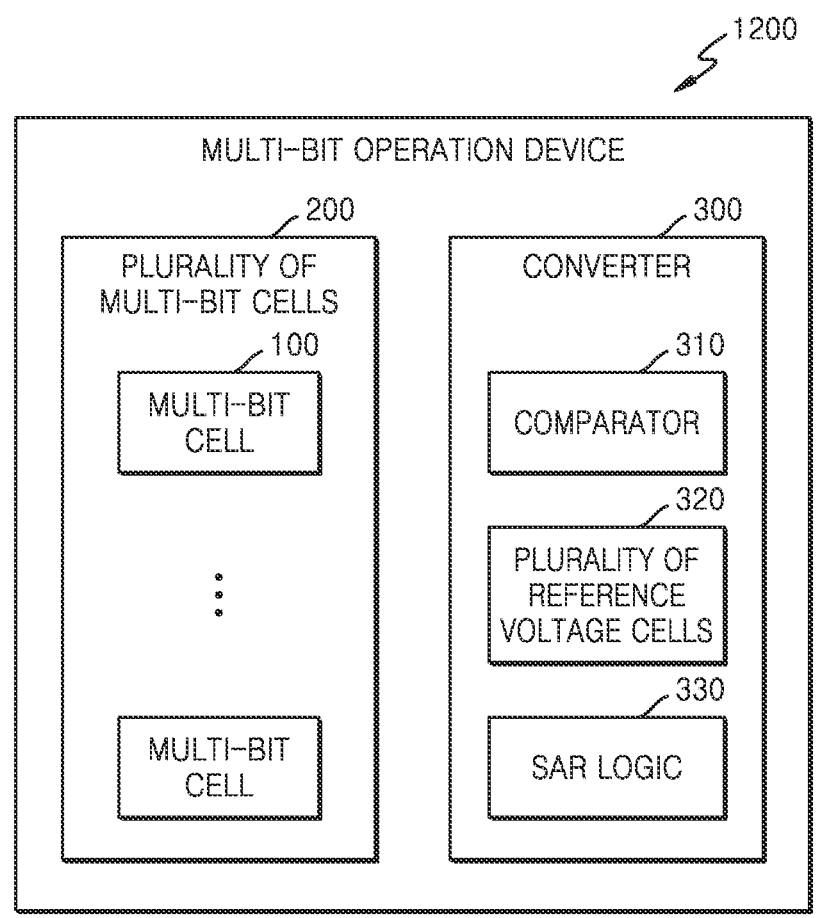
FIG. 12 is a block diagram illustrating a configuration of a multi-bit operation device, according to one or more embodiments.

FIG. 12 is a block diagram illustrating a configuration of a multi-bit operation device 1200 (e.g., a multi-bit operation device 1200) according to one or more embodiments.

Referring to FIG. 12, the multi-bit operation device 1200 may include a plurality of multi-bit cells 200 and a converter 300. The converter 300 may include a comparator 310, a plurality of reference voltage cells 320, and a successive approximation register (SAR) logic 330. In the multi-bit operation device 1200 illustrated in FIG. 12, only components related to the present embodiments are illustrated. Therefore, it is obvious to those of skill in the art that the multi-bit operation device 1200 may further include other general-purpose components in addition to the components illustrated in FIG. 12. The multi-bit cell 100 of FIG. 12 may correspond to the multi-bit cell 100 of FIG. 4.

The multi-bit operation device 1200 may include the plurality of multi-bit cells 200. The multi-bit operation device 1200 may generate second summed data by summing up all of the first summed data output from each of the multi-bit cells 200. The multi-bit operation device 1200 may output the second summed data, and input the second summed data to the converter 300. The converter 300 may convert the second summed data, which is analog data, into digital data.

Figure 13:
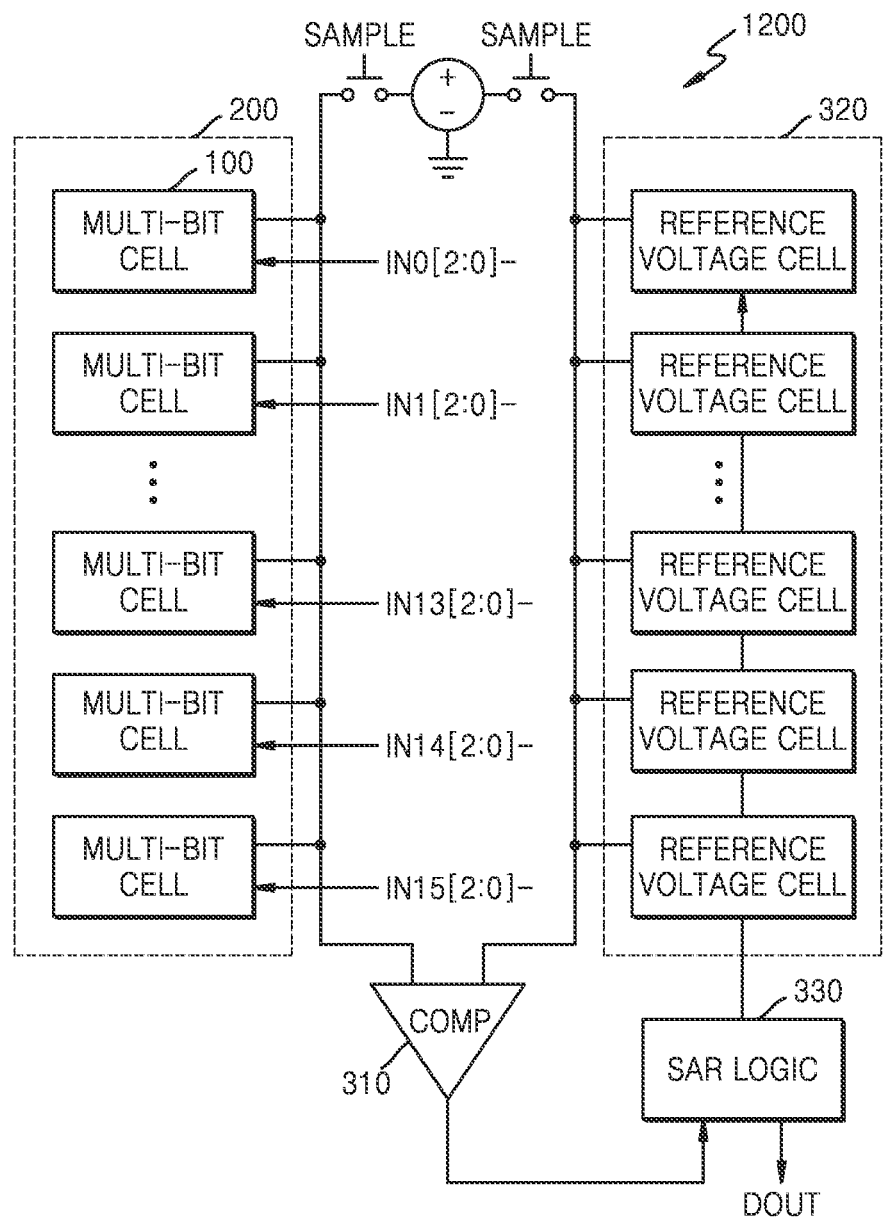
FIG. 13 is a circuit diagram of a multi-bit operation device according to one or more embodiments.

FIG. 13 is a circuit diagram of a multi-bit operation device (e.g., the multi-bit operation device 1200) according to one or more embodiments.

Referring to FIG. 13, the plurality of multi-bit cells 200 may be connected to each other in parallel, and a number of reference voltage cells 320, that corresponds to the number of the multi-bit cells 200, may also be connected to each other in parallel.

The multi-bit operation device 1200 may convert the second summed data, which is analog data, into digital data.

The multi-bit operation device 1200 may input the second summed data to the comparator 310 to convert the summed data into digital data. The comparator 310 may store data in which a range from the minimum value to the maximum value of the second summed data is divided into a preset number of sections, and may classify the second summed data based on the data. The comparator 310 may output data indicating a specific section to which the value of the second summed data belongs, from among the preset number of sections.

The SAR logic 330 may convert data received from the comparator 310 into digital data based on reference voltage data received from the reference voltage cells 320. The SAR logic 330 may perform digital conversion by comparing the data received from the comparator 310 with the reference voltage data. For example, the SAR logic 330 may perform the digital conversion by repeating an operation of maintaining a bit value in response to the data received from the comparator 310 being greater than the reference voltage data, and erasing the bit value in response to the data being less than the reference voltage data.

Meanwhile, the circuit diagram of the multi-bit operation device illustrated in FIG. 13 is merely an example, and the plurality of multi-bit cells 200 and the plurality of reference voltage cells 320 may be separated from each other. For example, each of the plurality of multi-bit cells 200 and each of the plurality of reference voltage cells 320 may receive a signal from a separate voltage source or a separate current source.

Figure 14:
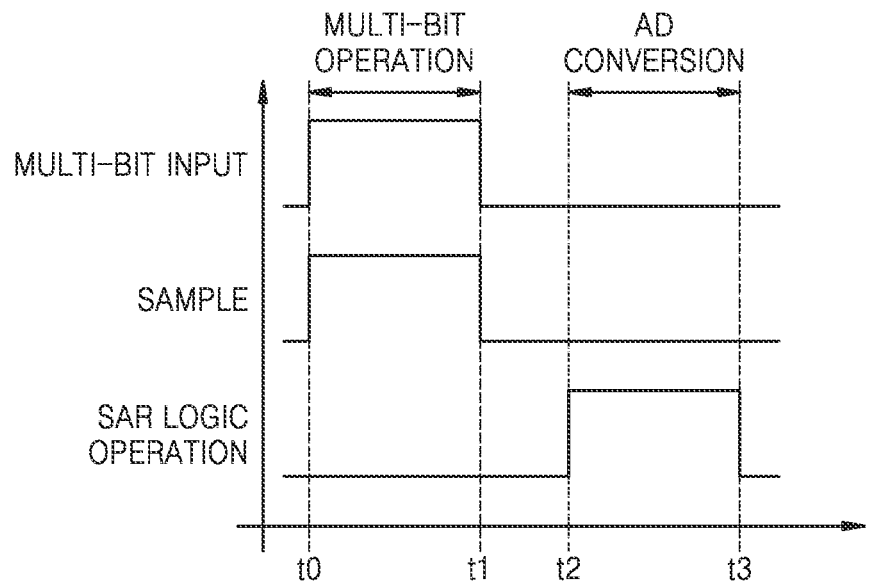
FIG. 14 is a graph illustrating a relationship between a period of time for a multi-bit operation and a period of time for digital conversion, according to one or more embodiments.

FIG. 14 is a graph illustrating a relationship between a period of time for multi-bit operation and a period of time for digital conversion, according to one or more embodiments.

As illustrated in FIG. 14, the period of time during which a multi-bit operation is performed to generate the charge data, the first summed data, and the second summed data, and the period of time during which digital conversion is performed to convert the second summed data into the digital data, may be separated from each other. The multi-bit operation device may increase computation efficiency and power efficiency by performing the multi-bit operation and the digital conversion at different times.

During the period of time for multi-bit operation, a sample voltage may be applied to the multi-bit cell and the multi-bit cell may receive a multi-bit input, such that the multi-bit operation may be performed by the multi-bit cell. In response to the first summed data being output from each of the multi-bit cells, the multi-bit operation device may generate the second summed data by summing up the first summed data.

During the period of time for digital conversion, the sample voltage being applied to the multi-bit cell is disabled, and the converter including the SAR logic may operate. The converter may convert the second summed data, which is analog data, into digital data.

Figure 15:
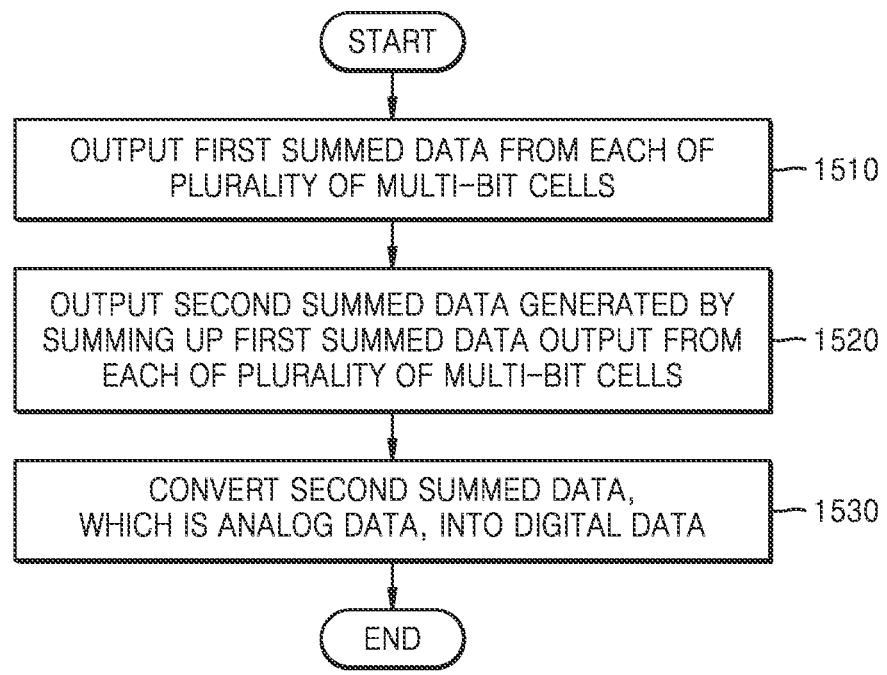
FIG. 15 is a flowchart illustrating an operating method of a multi-bit operation device, according to one or more embodiments.

FIG. 15 is a flowchart illustrating an operating method of a multi-bit operation device (e.g., the multi-bit operation device), according to one or more embodiments.

Referring to FIG. 15, the operating method of the multi-bit operation device includes operations that are processed in a time series by the multi-bit operation device illustrated in FIG. 12. Accordingly, it may be seen that the information described above regarding the multi-bit operation device with reference to FIGS. 12 to 14 also applies to the method of FIG. 15 even if it is omitted below.

In operation 1510, each of the plurality of multi-bit cells may output the first summed data.

In operation 1520, the multi-bit operation device may output the second summed data generated by summing up the first summed data output from each of the plurality of multi-bit cells.

In operation 1530, the multi-bit operation device may convert the second summed data, which is analog data, into digital data.

The multi-bit operation device may include the converter that converts the second summed data, which is analog data, into digital data. The converter may include the comparator, the plurality of reference voltage cells, and the SAR logic.

Figure 16:
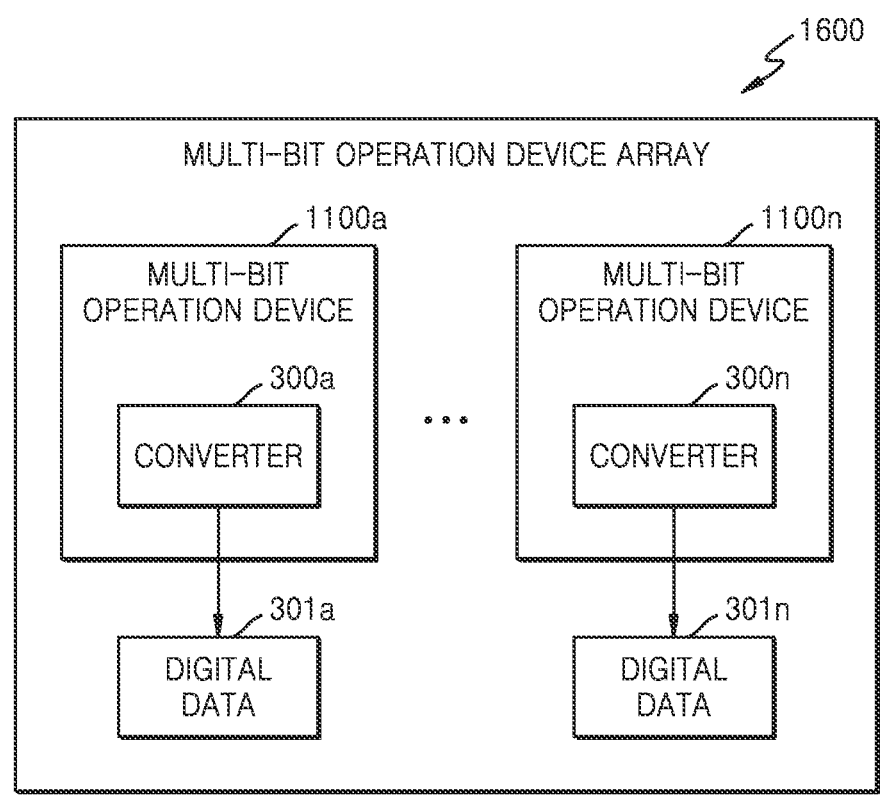
FIG. 16 is a block diagram illustrating a configuration of a multi-bit operation device array, according to one or more embodiments.

FIG. 16 is a block diagram illustrating a configuration of a multi-bit operation device array (e.g., a multi-bit operation device array 1600), according to one or more embodiments.

Referring to FIG. 16, the multi-bit operation device array 1600 may include a plurality of multi-bit operation devices 1100a to 1100n. Each multi-bit operation device 1100a may include a converter 300a, and the converter 300a may output digital data 301a. In the multi-bit operation device array 1600 illustrated in FIG. 14, only components related to the present embodiments are illustrated. Therefore, it is obvious to those of skill in the art that the multi-bit operation device array 1600 may further include other general-purpose components in addition to the components illustrated in FIG. 16. The multi-bit operation device 1100a and the converter 300a of FIG. 16 may correspond to the multi-bit operation device 1100 and the converter 300 of FIG. 12.

Each of the multi-bit operation devices 1100a to 1100n may generate and output digital data by converting the second summed data output from the multi-bit cells. The multi-bit operation device array 1600 may output a final operation result for an input to the multi-bit operation device array 1600 by combining the digital data 301a to 301n output from the respective multi-bit operation devices 1100a to 1100n. The multi-bit operation device array 1600 may correspond to, for example, the neural network 20 of FIG. 2 composed of a plurality of layers including the input layer and the output layer.

Figure 17:
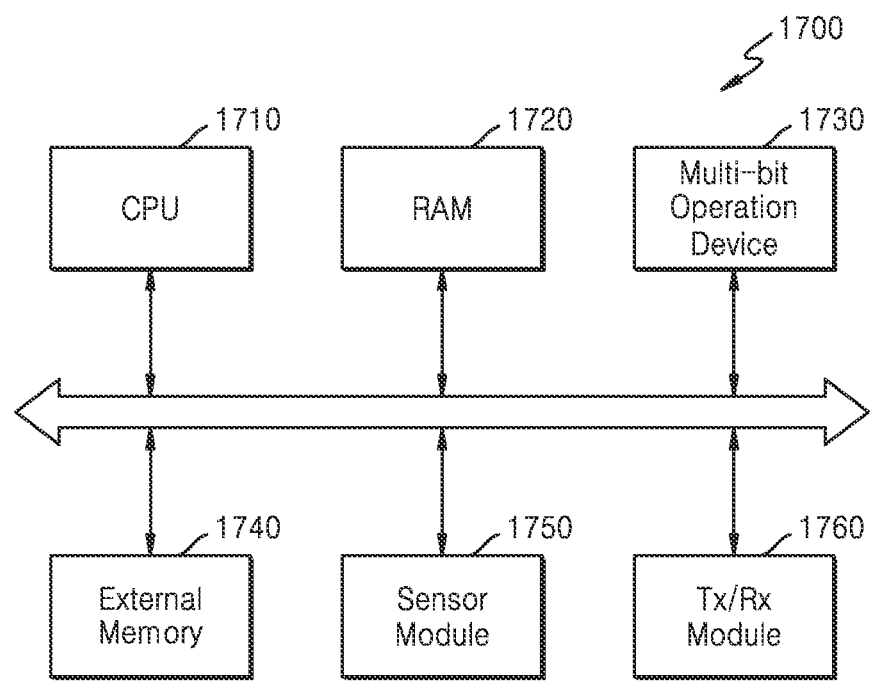
FIG. 17 is a block diagram illustrating an electronic system according to one or more embodiments.

FIG. 17 is a block diagram illustrating an electronic system (e.g., an electronic system 1700) according to one or more embodiments.

Referring to FIG. 17, the electronic system 1700 may extract valid information by analyzing input data based on a multi-bit operation device 1730, may determine a situation based on the extracted information, or control components of an electronic device on which the electronic system 1700 is mounted. For example, the electronic system 1700 may be applied to a robotic apparatus, such as a drone or an advanced driver-assistance system (ADAS), a smart TV, a smart phone, a medical device, a mobile device, an image display device, a measuring device, or an IoT device, and may be mounted on various types of electronic devices.

The electronic system 1700 may include a central processing unit (CPU) 1710, a random-access memory (RAM) 1720, an external memory 1740, a sensor module 1750, and a communication (transmitter/receiver (Tx/Rx)) module 1760, in addition to the multi-bit operation device 1730. In addition, the electronic system 1700 may further include an input/output module, a security module, a power control device, etc. Some of hardware components of the electronic system 1700 may be mounted on a semiconductor chip. The multi-bit operation device 1730 may be implemented in an on-chip manner by using the multi-bit operation device described with reference to the above drawings, or may be a device including the multi-bit operation device described with reference to the above drawings as a part thereof.

The CPU 1710 controls overall operations of the electronic system 1700. The CPU 1710 may include a single processor core (single-core) or a plurality of processor cores (multi-core). The CPU 1710 may process or execute programs and/or data stored in the external memory 1740. The CPU 1710 may control a function of the multi-bit operation device 1730 by executing the programs stored in the external memory 1740. The functions of the CPU 1710 may be implemented by a graphics processing unit (GPU), an application processor (AP), or the like.

The RAM 1720 may temporarily store programs, data, or instructions. For example, the programs and/or the data stored in the external memory 1740 may be temporarily stored in the RAM 1720 according to control by or booting code of the CPU 1710. The RAM 1720 may be implemented as a memory device such as a dynamic RAM (DRAM) or a static RAM (SRAM).

The multi-bit operation device 1730 may perform a multi-bit operation based on received input data, and may generate an information signal based on a result of the multi-bit operation. The multi-bit operation device 1730 may be used as a neuromorphic device or a neural network device. The neural network may include convolution neural networks (CNNs), recurrent neural networks (RNNs), deep belief networks, restricted Boltzman machines, etc., but is not limited thereto. The multi-bit operation device 1730 may correspond to a hardware accelerator dedicated to a neural network. The multi-bit operation device 1730 may be applied to various systems that perform an operation on a multi-bit input and a multi-bit weight, in addition to neuromorphic devices or neural network devices.

The information signal may include various types of recognition signals such as a voice recognition signal, an object recognition signal, an image recognition signal, a biometric information recognition signal, etc. For example, the multi-bit operation device 1730 may receive frame data included in a video stream as input data, and may generate a recognition signal with respect to an object included in an image represented by the frame data. The multi-bit operation device 1730 may receive various types of input data according to the type or functions of an electronic device on which the electronic system 1700 is mounted, and may generate a recognition signal according to the input data.

The external memory 1740 is a storage space for storing data, and may store an operating system (OS), various programs, and various types of data. The external memory 1740 may include a volatile memory or a non-volatile memory. The non-volatile memory includes read-only memory (ROM), programmable ROM (PROM), electrically programmable ROM (EPROM), electrically erasable and programmable ROM (EEPROM), flash memory, phase-change RAM (PRAM), MRAM, resistive RAM (RRAM), ferroelectric RAM (FeRAM), etc. The volatile memory includes DRAM, SRAM, synchronous DRAM (SDRAM), phase-change RAM (PRAM), MRAM, resistive RAM (RRAM), FeRAM, etc. The external memory 1740 may include, for example, a hard disk drive (HDD), a solid state drive (SSD), CompactFlash (CF), secure digital (SD), micro-secure digital (Micro-SD), mini-secure digital (Mini-SD), extreme digital (xD), or memory stick.

The sensor module 1750 may collect surrounding information of the electronic device on which the electronic system 1700 is mounted. The sensor module 1750 may sense or receive a signal (e.g., an image signal, a voice signal, a magnetic signal, a biometric signal, or a touch signal) from the outside of the electronic device, and may convert the sensed or received signal into data. To this end, the sensor module 1750 may be any one of various types of sensing devices, for example, a microphone, an image capturing device, an image sensor, a light detection and ranging (LIDAR) sensor, an ultrasonic sensor, an infrared sensor, a bio-sensor, a touch sensor, or the like.

The sensor module 1750 may provide the converted data to the multi-bit operation device 1730 as input data. For example, the sensor module 1750 may include an image sensor, may generate a video stream by capturing images of an external environment of the electronic device, and may sequentially provide consecutive data frames of the video stream as input data, to the multi-bit operation device 1730. However, the present disclosure is not limited thereto, and the sensor module 1750 may provide various types of data to the multi-bit operation device 1730.

The communication module 1760 may include various wired or wireless interfaces capable of communicating with an external device. For example, the communication module 1760 may include a local area network (LAN), a wireless LAN (WLAN) such as wireless fidelity (Wi-Fi), a wireless personal area network (WPAN) such as Bluetooth, wireless universal serial bus (USB), ZigBee, near field communication (NFC), radio-frequency identification (RFID), power line communication (PLC), or communication interfaces capable of accessing a mobile cellular network, such as, 3rd generation (3G), 4th generation (4G), long-term evolution (LTE), or 5th generation (5G).

The electronic system 1700 may further include a processor, a memory device that stores and executes program data, a permanent storage such as a disk drive, a communication port that communicates with an external device, and a user interface device such as a touch panel, a key, or a button. Methods implemented as a software module or an algorithm may be stored in a computer-readable recording medium, as computer-readable code or program instructions executable by a processor.

The multi-bit operation devices, multi-bit cells, memories, current sources, multiplexers, capacitors, resistive elements, sign multiplexers, first memories, second memories, first current sources, second current sources, converters, comparators, reference voltage cells, SAR logics, multi-bit operation device arrays, electronic systems, CPUs, RAMs, external memories, sensor modules, Tx/Rx modules, multi-bit operation device 30, multi-bit cell 100, memory 110, current source 120, multiplexers 130, capacitors 140, multiplexer 131, capacitor 141, resistive elements 111, resistive element 111*a*, sign multiplexer 132, first memory 110*a*, second memory 110*b*, first current source 120*a*, second current source 120*b*, multi-bit operation device 1200, multi-bit cells 200, converter 300, comparator 310, reference voltage cells 320, SAR logic 330, multi-bit operation device array 1600, multi-bit operation devices 1100*a* to 1100*n*, converter 300*a*, electronic system 1700, CPU 1710, RAM 1720, external memory 1740, sensor module 1750, Tx/Rx module 1760, multi-bit operation device 1730, and other apparatuses, devices, units, modules, and components described herein with respect to FIGS. 1-17 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-17 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions used herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

What is claimed is:

1. A multi-bit cell comprising:
   a memory storing weight resistances corresponding to multi-bit weights;
   a current source configured to apply a current to the memory to generate a weight voltage from a respective weight resistance;

a plurality of multiplexers connected to each other in parallel and connected to the memory in series, each of the multiplexers being configured to:
  receive a different bit of a multi-bit input; and
  in response to the different bit, output one signal from either the weight voltage or a first fixed voltage; and
a plurality of capacitors connected to the plurality of multiplexers, respectively, each of the capacitors being configured to:
  store a respective weight capacitance; and
  generate charge data by performing an operation on the outputted one signal and the respective weight capacitance.

2. The multi-bit cell of claim 1, wherein
the memory comprises a plurality of resistive elements connected to each other in series,
a number of the resistive elements corresponds to a number of bits of the multi-bit weight, and
the multi-bit cell is configured to adjust the weight resistance by controlling ON/OFF of each of the resistive elements.

3. The multi-bit cell of claim 1, wherein each of the plurality of multiplexers is configured to:
  receive an input of 1 or 0;
  output the weight voltage in response to receiving the input of 1; and
  output the first fixed voltage in response to receiving the input of 0.

4. The multi-bit cell of claim 1, wherein, in response to all of the plurality of multiplexers outputting the first fixed voltage, the multi-bit cell is configured to reduce power consumption by turning off the current source.

5. The multi-bit cell of claim 1, wherein
a magnitude of a second fixed voltage transmitted to a terminal opposite to a terminal of the capacitor to which the outputted one signal is transmitted is a same as a magnitude of the first fixed voltage, and
each of the plurality of capacitors, in response to reception of the first fixed voltage, is configured to receive a voltage of 0 V according to potentials at both terminals thereof being same, and to generate charge data of 0 C.

6. The multi-bit cell of claim 5, wherein
the weight resistance is set to linearly increase as the multi-bit weight increases, and
the magnitude of the second fixed voltage is set such that a difference value between the second fixed voltage and the weight voltage is proportional to the multi-bit weight.

7. The multi-bit cell of claim 1, wherein
a number of the capacitors corresponds to a number of bits of the multi-bit input, and
each of the capacitors is configured to store a weight capacitance of a value corresponding to a position of a respective digit of the multi-bit input.

8. The multi-bit cell of claim 7, wherein a value of each respective digit constituting the multi-bit input is input to a multiplexer of the multiplexers connected to a capacitor of the capacitors corresponding to a position of each of the respective digit.

9. The multi-bit cell of claim 1, wherein each of the plurality of capacitors is configured to:
  receive the outputted one signal at one terminal thereof;
  receive a second fixed voltage at a terminal opposite to the one terminal;
  perform a subtraction operation of the second fixed voltage with respect to the outputted one signal; and
  multiply a difference value by the respective weight capacitance to generate the charge data.

10. The multi-bit cell of claim 1, wherein the multi-bit cell is configured to output first summed data generated by summing the charge data generated by each of the plurality of capacitors.

11. The multi-bit cell of claim 1, wherein
the memory comprises a first memory and a second memory that each store different weight resistances,
the multi-bit cell further comprises a sign multiplexer configured to determine, based on a sign input, one memory of either the first memory and the second memory to which the current is to be applied, and
the multi-bit cell is configured to generate a weight voltage from the weight resistance stored in the determined one memory.

12. The multi-bit cell of claim 1, wherein
the memory comprises a first memory storing a first weight resistance and a second memory storing a second weight resistance,
the current source comprises a first current source configured to apply a current to the first memory to generate a first weight voltage, and a second current source configured to apply a current to the second memory to generate a second weight voltage, and
each of the plurality of multiplexers is configured to output any one of the first weight voltage, the second weight voltage, and the first fixed voltage, based on the multi-bit input including a sign input.

13. A multi-bit operation device comprising a plurality of multi-bit cells of claim 10, wherein the multi-bit operation device is configured to output second summed data generated by summing first summed data output from each of the plurality of multi-bit cells.

14. The multi-bit operation device of claim 13, further comprising a converter configured to convert the second summed data, which is analog data, into digital data,
wherein the converter comprises a comparator, a plurality of reference voltage cells, and a successive approximation register (SAR) logic.

15. A method of performing a multi-bit operation, the method comprising:
applying a current to a memory storing weight resistances corresponding to multi-bit weights, to generate a weight voltage from a respective weight resistance;
receiving a multi-bit input with respect to a plurality of capacitors each storing a respective weight capacitance and connected to a plurality of multiplexers;
receiving, by each of the plurality of multiplexers connected to each other in parallel and connected to the memory in series, a different bit of a multi-bit input;
outputting, by each of the plurality of multiplexers, in response to the different bit, one signal from either the weight voltage or a first fixed voltage to each of the plurality of capacitors; and
generating charge data stored in each of the plurality of capacitors by performing an operation on the outputted one signal and the respective weight capacitance.

16. The method of claim 15, further comprising outputting first summed data generated by summing the charge data stored in each of the plurality of capacitors.

17. The method of claim 16, further comprising:
performing the outputting of the first summed data at each of a plurality of multi-bit cells; and
outputting second summed data generated by summing the first summed data output from each of the plurality of multi-bit cells.

18. The method of claim 17, further comprising converting the second summed data, which is analog data, into digital data.

19. A non-transitory computer-readable storage medium storing instructions that, when executed by a processor, configure the processor to perform the method of claim 15.

\* \* \* \* \*